United States Patent
Gross et al.

(10) Patent No.: US 11,116,098 B2
(45) Date of Patent: Sep. 7, 2021

(54) DYNAMICALLY BENDABLE AUTOMOTIVE INTERIOR DISPLAY SYSTEMS

(71) Applicant: CORNING INCORPORATED, Corning, NY (US)

(72) Inventors: Timothy Michael Gross, Corning, NY (US); Khaled Layouni, Painted Post, NY (US); Torsten Nath, Berlin (DE); Wendell Porter Weeks, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/877,712

(22) PCT Filed: Dec. 9, 2019

(86) PCT No.: PCT/US2019/065199
§ 371 (c)(1),
(2) Date: May 19, 2020

(87) PCT Pub. No.: WO2020/123367
PCT Pub. Date: Jun. 18, 2020

(65) Prior Publication Data
US 2021/0029842 A1  Jan. 28, 2021

Related U.S. Application Data

(60) Provisional application No. 62/789,888, filed on Jan. 8, 2019, provisional application No. 62/789,513, filed
(Continued)

(51) Int. Cl.
*H05K 5/03* (2006.01)
*B60K 37/02* (2006.01)
(Continued)

(52) U.S. Cl.
CPC ............... *H05K 5/03* (2013.01); *B60K 37/02* (2013.01); *G06F 1/1652* (2013.01);
(Continued)

(58) Field of Classification Search
CPC ........ H05K 5/03; H05K 5/0017; B60K 37/02; B60K 2370/67; B60K 2370/1533;
(Continued)

(56) References Cited

U.S. PATENT DOCUMENTS 9,321,679 B2  4/2016  Chang et al.
9,606,625 B2  3/2017  Levesque et al.
(Continued)

FOREIGN PATENT DOCUMENTS

CN  103136490 A  6/2013
CN  205239166 U  5/2016
(Continued)

OTHER PUBLICATIONS

Chen et al., "Technology Advances in Flexible Displays and Substrates", Digital Object Identifier, vol. 1, 2013, pp. 150-158.
(Continued)

*Primary Examiner* — Patrick N Edouard
*Assistant Examiner* — Douglas M Wilson
(74) *Attorney, Agent, or Firm* — Payal A. Patel

(57) ABSTRACT

Embodiments of a dynamically bendable automotive interior display system are disclosed. In one or more embodiments, the system includes a display, a dynamically bendable cover substrate assembly disposed over the display, wherein the cover substrate assembly comprises a cover substrate with a bend axis, and a reversible support attached to at least a portion the cover substrate that dynamically bends the cover substrate along the bend axis in a cycle from a first radius of curvature to a second radius of curvature and from the second radius of curvature to the first radius of
(Continued)

curvature. In one or more embodiments, the system includes one or more frames that partially house the display and are attached to the cover substrate.

27 Claims, 19 Drawing Sheets

Related U.S. Application Data on Jan. 7, 2019, provisional application No. 62/777,236, filed on Dec. 10, 2018.

(51) Int. Cl.
*H05K 5/00* (2006.01)
*G06F 1/16* (2006.01)
*G02F 1/1333* (2006.01)

(52) U.S. Cl.
CPC ...... *H05K 5/0017* (2013.01); *B32B 2307/552* (2013.01); *B32B 2307/558* (2013.01); *B32B 2307/56* (2013.01); *B32B 2457/20* (2013.01); *B60K 2370/1533* (2019.05); *B60K 2370/67* (2019.05); *G02F 1/133305* (2013.01)

(58) Field of Classification Search
CPC ....... B60K 37/04; B60K 35/00; G06F 1/1652; G02F 1/133305; B32B 2457/20; B32B 2307/558; B32B 2307/56; B32B 2307/552
See application file for complete search history.

(56) References Cited

U.S. PATENT DOCUMENTS

| | | | |
|---|---|---|---|
| 9,720,450 | B2 | 8/2017 | Lee et al. |
| 9,933,820 | B2 | 4/2018 | H¿Lot et al. |
| 9,947,882 | B2 | 4/2018 | Zhang et al. |
| 9,972,645 | B2 | 5/2018 | Kim |
| 10,042,391 | B2 | 8/2018 | Lee et al. |
| 10,074,824 | B2 | 9/2018 | Lee et al. |
| 10,086,762 | B2 | 10/2018 | Uhm |
| 10,140,018 | B2 | 11/2018 | Kim et al. |
| 10,153,337 | B2 | 12/2018 | Lee et al. |
| 10,211,416 | B2 | 2/2019 | Jin et al. |
| 10,222,825 | B2 | 3/2019 | Wang et al. |
| 10,303,223 | B2 | 5/2019 | Park et al. |
| 10,326,101 | B2 | 6/2019 | Oh et al. |
| 10,328,865 | B2 | 6/2019 | Jung |
| 10,642,318 | B1 | 5/2020 | Lehmann et al. |
| 2012/0200991 | A1* | 8/2012 | Ryu ................... G06F 1/1652 361/679.01 |
| 2016/0081204 | A1 | 3/2016 | Park et al. |
| 2016/0224059 | A1* | 8/2016 | Song ...................... H04N 5/64 |
| 2016/0224069 | A1* | 8/2016 | Chang .................... B32B 17/06 |
| 2017/0115944 | A1 | 4/2017 | Oh et al. |
| 2017/0185289 | A1 | 6/2017 | Kim et al. |
| 2017/0213872 | A1 | 7/2017 | Jinbo et al. |
| 2017/0217290 | A1 | 8/2017 | Tajima et al. |
| 2018/0011518 | A1* | 1/2018 | Choi ................... G06F 1/1652 |
| 2018/0103132 | A1 | 4/2018 | Prushinskiy et al. |
| 2018/0155238 | A1 | 6/2018 | Kim et al. |
| 2018/0164850 | A1 | 6/2018 | Sim et al. |
| 2018/0188869 | A1 | 7/2018 | Boggs et al. |
| 2018/0217639 | A1* | 8/2018 | Jones ................... G06F 1/1652 |
| 2018/0324964 | A1 | 11/2018 | Kim et al. |
| 2018/0364760 | A1 | 12/2018 | Ahn et al. |
| 2018/0374906 | A1 | 12/2018 | Salmon et al. |
| 2019/0069451 | A1 | 2/2019 | Myers et al. |
| 2019/0152831 | A1 | 5/2019 | An et al. |
| 2019/0244563 | A1* | 8/2019 | Kishimoto ................ G09F 9/35 |
| 2019/0295494 | A1 | 9/2019 | Wang et al. |

FOREIGN PATENT DOCUMENTS

| | | |
|---|---|---|
| CN | 205905907 U | 1/2017 |
| CN | 107613809 A | 1/2018 |
| CN | 107757516 A | 3/2018 |
| CN | 108519831 A | 9/2018 |
| CN | 108550587 A | 9/2018 |
| CN | 108725350 A | 11/2018 |
| CN | 108779025 A | 11/2018 |
| CN | 109690662 A | 4/2019 |
| CN | 109743421 A | 5/2019 |
| DE | 19959084 A1 | 6/2001 |
| DE | 102014016323 A1 | 5/2016 |
| EP | 1635313 A2 | 3/2006 |
| EP | 3288791 A1 | 3/2018 |
| EP | 3333137 A1 | 6/2018 |
| IN | 201837014966 | 6/2014 |
| IN | 201717042664 | 3/2018 |
| IN | 201827024214 | 8/2018 |
| KR | 10-1674060 B1 | 11/2016 |
| KR | 10-2017-0107124 A | 9/2017 |
| KR | 10-2017-0113822 A | 10/2017 |
| KR | 10-2017-0121674 A | 11/2017 |
| KR | 10-2018-0028597 A | 3/2018 |
| KR | 10-2018-0049484 A | 5/2018 |
| KR | 10-2018-0101514 A | 9/2018 |
| KR | 10-2019-0001864 A | 1/2019 |
| KR | 10-2019-0081264 A | 7/2019 |
| VN | 58334 | 7/2018 |
| WO | 2016/070974 A1 | 5/2016 |
| WO | 2016/173699 A1 | 11/2016 |
| WO | 2018/112181 A1 | 6/2018 |
| WO | 2018/134004 A1 | 7/2018 |
| WO | 2019/151618 A1 | 8/2019 |

OTHER PUBLICATIONS

Garner et al., "Ultra-Slim Flexible Glass for Roll-to-Roll Electronic Device Fabrication", Appl. Phys. A, vol. 116, 2014, pp. 403-407.
International Search Report and Written Opinion of the International Searching Authority; PCT/US2019/065199; dated Mar. 20, 2020; 14 Pages; European Patent Office.
International Search Report and Written Opinion of the International Searching Authority; PCT/US2019/065203; dated Mar. 20, 2020; 14 Pages; European Patent Office.
Li et al., "A New Twist on Glass: A Brittle Material Enabling Flexible Integrated Photonics", International Journal of Applied Glass Science, vol. 8, No. 1, 2017, pp. 61-68.
Shi et al., "A 9.55-Inch Flexible Top-Emission AMOLED with a-IGZO TFTs", SID 2014 Digest, 2014, pp. 330-333.
Weber et al., "6.3: Thin Glass-Polymer Systems as Flexible Substrates for Displays", SID 02 Digest, pp. 53-55.

* cited by examiner

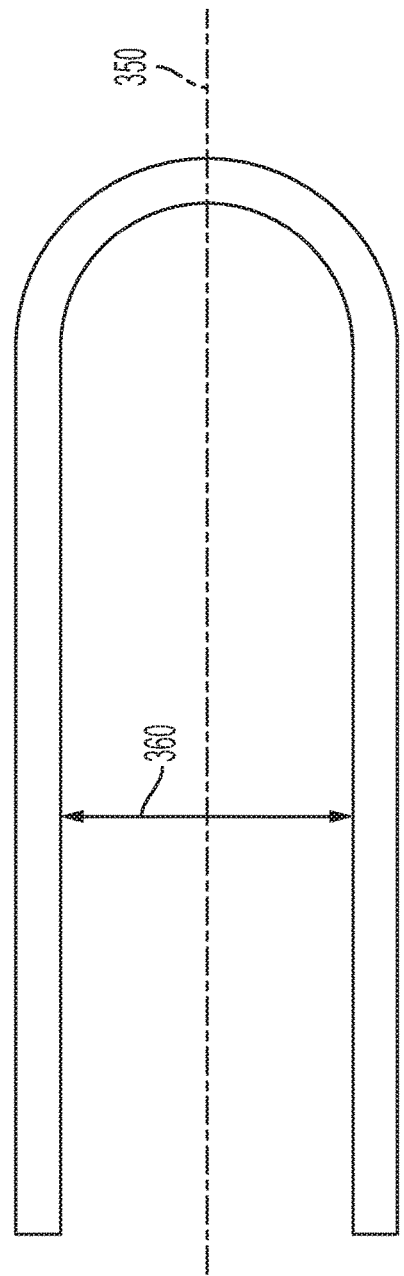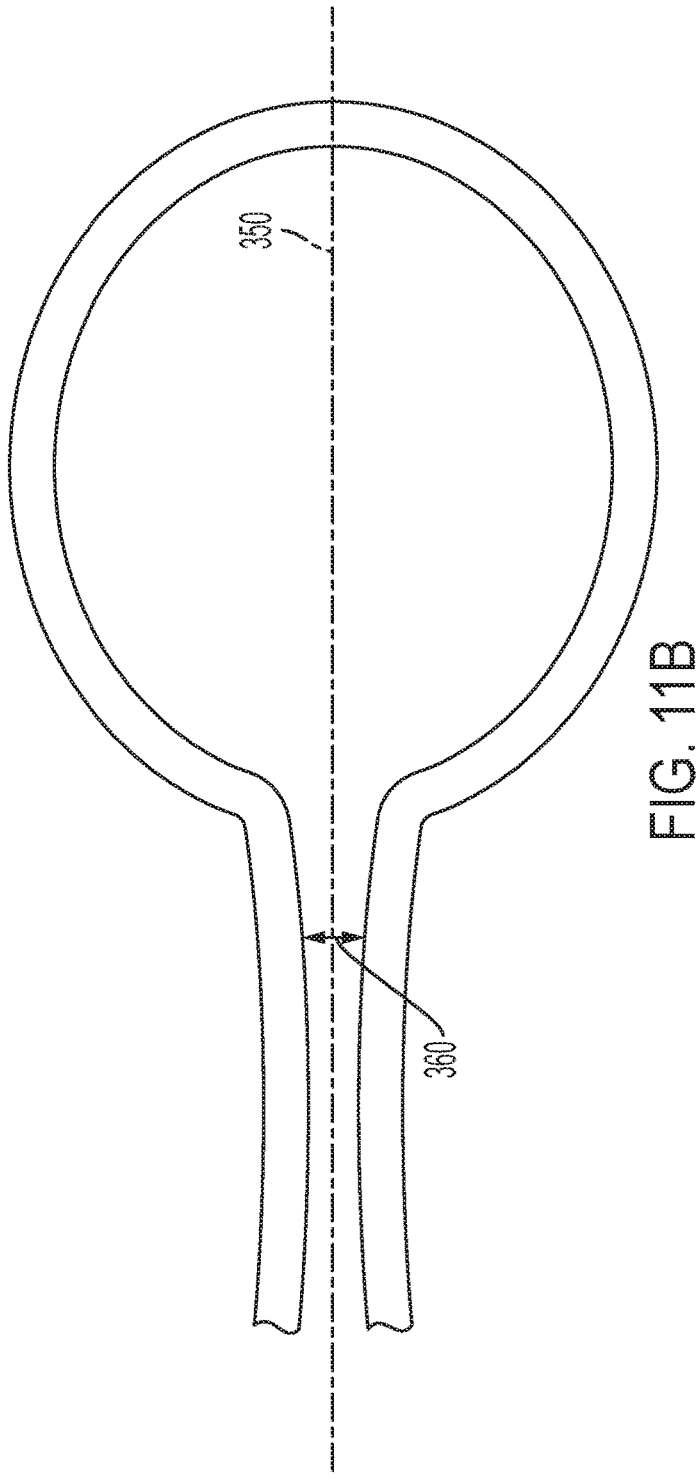

DYNAMICALLY BENDABLE AUTOMOTIVE INTERIOR DISPLAY SYSTEMS

CROSS-REFERENCE TO RELATED APPLICATIONS

This application is a 371 of PCT Application No.: PCT/US2019/065199 filed on Dec. 9, 2019, which claims the benefit of priority under 35 U.S.C. § 119 of U.S. Provisional Application Ser. No. 62/789,888 filed on Jan. 8, 2019 and U.S. Provisional Application Ser. No. 62/789,513 filed on Jan. 7, 2019 and U.S. Provisional Application Ser. No. 62/777,236 filed on Dec. 10, 2018, the content of which are relied upon and incorporated herein by reference in their entirety.

The disclosure relates to dynamically bendable cover substrates and automotive interior display systems, and more particularly to dynamically bendable automotive interior display systems with a reversible support that dynamically bends a cover substrate sequentially at least from a first radius of curvature to a second radius of curvature and to the first radius of curvature.

Automotive interiors systems can include surfaces that incorporate displays and/or touch panel and a cover substrate disposed over the displays and/or touch panels. There is a desire to change the shape of the surfaces and in particular, to dynamically change the shape of the surface according to a viewer's needs or preferences. Such dynamic movements should still allow the automotive interiors systems to meet rigorous headform impact test (HIT) requirements. In some instances, the cover substrate should not break after being impacted in the HIT. Accordingly, there is a need for dynamically bendable cover substrates and automotive interior display systems that exhibit improved headform impact performance.

SUMMARY

A first aspect of this disclosure pertains to a dynamically bendable cover substrate. In one or more embodiments, the cover substrate includes a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis, wherein the cover substrate is dynamically bendable around the bend axis in a repeating cycle from a first radius of curvature to a second radius of curvature and from the second radius of curvature to the first radius of curvature.

A second aspect of this disclosure pertains to a display system comprising a display; a dynamically bendable cover substrate assembly disposed over the display; wherein the cover substrate assembly comprises a cover substrate having a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and a reversible support attached to at least a portion the second major surface of the cover substrate that dynamically bends the cover substrate along the bend axis in a cycle from a first radius of curvature to a second radius of curvature and from the second radius of curvature to the first radius of curvature.

A third aspect of this disclosure pertains to a display system comprising: a first frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface; a display disposed in the frame opening within the interior surface; a dynamically bendable cover substrate disposed on the first frame surface and over the display, the cover substrate having a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and a reversible support attached to at least a portion of the second frame surface and dynamically bends the cover substrate along the bend axis in a cycle from a first radius of curvature to a second radius of curvature and from the second radius of curvature to the first radius of curvature.

In one or more embodiments, the display system includes a second frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface; and a second display disposed in the frame opening within the interior surface of the second frame, wherein the reversible support is attached to the second frame surface of the first frame and the second frame surface of the second frame, and positioned between the first frame and the second frame. In one or more embodiments, the bend axis is positioned between the first frame and the second frame.

As used herein, throughout this disclosure unless otherwise noted, where a display is used, a touch panel may be substituted or used in addition to the display.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIGS. 11A and 11B show a side view of a cover substrate that may be foldable.

DETAILED DESCRIPTION

Reference will now be made in detail to various embodiments, examples of which are illustrated in the accompanying drawings.

Figure 1:
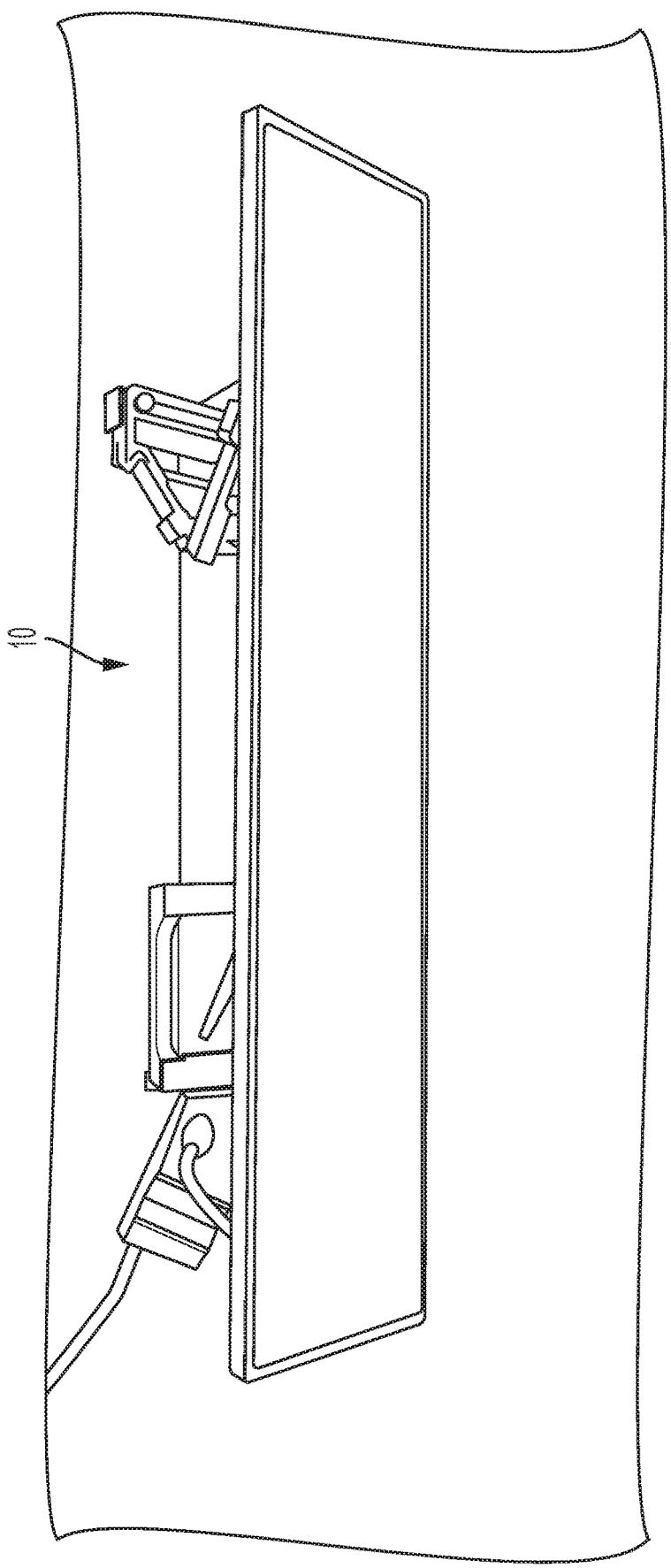
FIG. 1 is a perspective view of a known dynamically bendable automotive interior display system, when the cover substrate has a first radius of curvature.
Figure 2A:
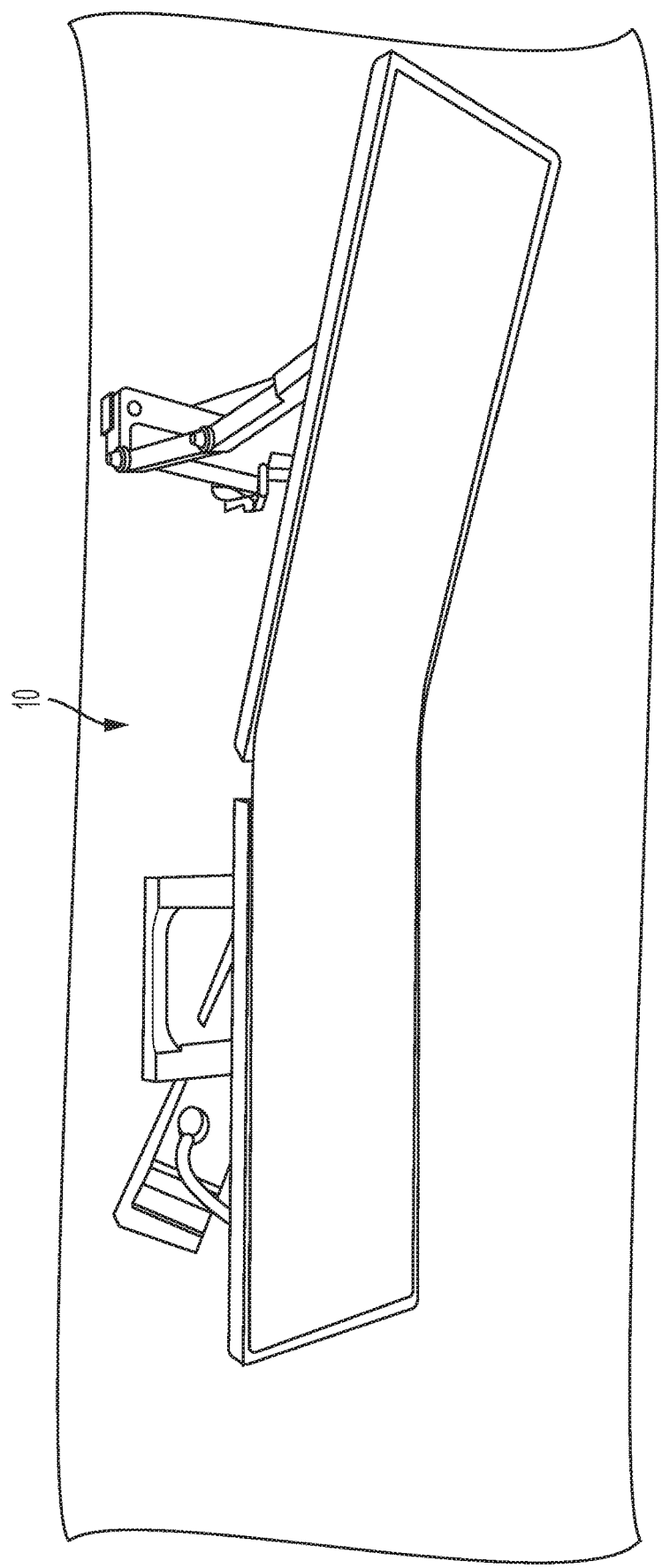
FIG. 2A is a perspective view of the system of FIG. 1 when the cover substrate has a second radius of curvature.
Figure 2B:
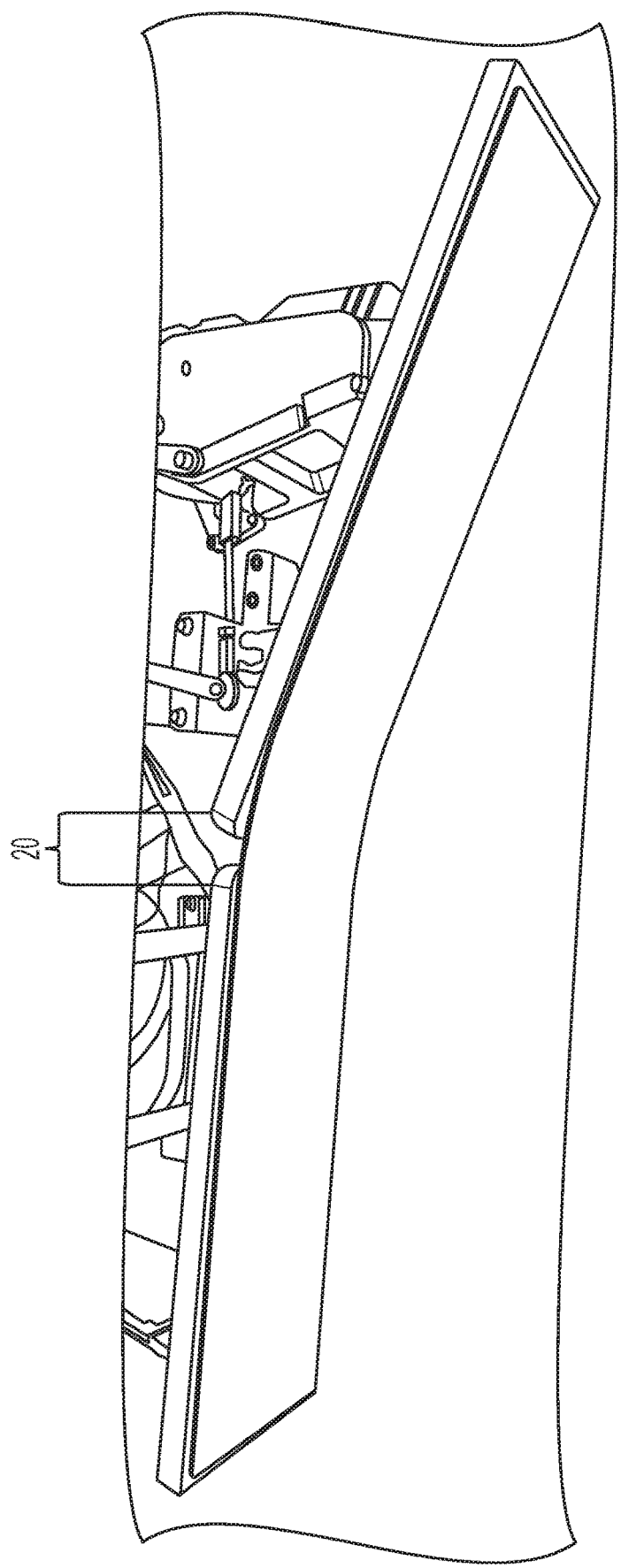
FIG. 2B is an enlarged view of the system of FIG. 2A.

In known display systems, such as the system 10 shown in FIG. 1, the cover substrate in dynamically bendable display systems is unsupported when the cover substrate is bent. As shown in FIG. 1, the cover substrate is partially adhered to a frame allowing local dynamic bending in the non-adhered area 20, as shown in FIGS. 2A and 2B. FIG. 2A is the cover substrate having a first radius of curvature, and FIG. 2B shows the cover substrate dynamically bent to have a second radius of curvature. As used herein, the phrase "radius of curvature" refers to the radius of curvature of the first major surface, the second major surface, or both the first and second major surface of the cover substrate (and not a local radius of curvature) adjacent the bend axis. The radius of curvature is the minimum radius of curvature in a given configuration. Without adequate support, there is an increase risk of local stress or bending local in the cover substrate during use (or when the cover substrate is dynamically bent), since the structural integrity is provided by the cover substrate alone. The absence of a support at the bend axis leads to low stiffness which compromises resistance during HIT.

A first aspect of this disclosure pertains to a dynamically bendable display system that includes a reversible support. In one or more embodiments, the reversible support is easily bent, offers local support to the cover substrate at a bend axis, and does not damage the cover substrate.

In one or more embodiments, the dynamically bendable automotive interior display system 100 includes a display 150, a dynamically bendable cover substrate assembly (120, 130 and 140) disposed over the display. In the embodiments, herein the display may be replaced with a touch panel or may have touch functionality. In one or more embodiments, the system 100 includes an adhesive between the cover substrate assembly and the display. The cover substrate assembly of one or more embodiments includes a cover substrate 120 having a first major surface 121, second major surface 122 opposing the first major surface and a minor surface 126 connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis 125 that defines a bend axis. As used herein, thickness (t) as used herein refers to the maximum thickness of the cover substrate. In one or more embodiments, the cover substrate comprises a plurality of bend axes. The bend axis may extend across the entire width, the entire length or a diagonal of the cover substrate.

The cover substrate may include an inorganic material and may include an amorphous substrate, a crystalline substrate or a combination thereof. The cover substrate may be formed from man-made materials and/or naturally occurring materials (e.g., quartz and polymers). For example, in some instances, the cover substrate may be characterized as organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

In some specific embodiments, the cover substrate may specifically exclude polymeric, plastic and/or metal substrates. In one or more embodiments, the substrate exhibits a refractive index in the range from about 1.45 to about 1.55. In specific embodiments, the cover substrate may exhibit an average strain-to-failure at a surface on one or more opposing major surface that is 0.5% or greater, 0.6% or greater, 0.7% or greater, 0.8% or greater, 0.9% or greater, 1% or greater, 1.1% or greater, 1.2% or greater, 1.3% or greater, 1.4% or greater 1.5% or greater or even 2% or greater, as measured using ball-on-ring testing using at least 5, at least 10, at least 15, or at least 20 samples. In specific embodiments, the cover substrate may exhibit an average strain-to-failure at its surface on one or more opposing major surface of about 1.2%, about 1.4%, about 1.6%, about 1.8%, about 2.2%, about 2.4%, about 2.6%, about 2.8%, or about 3% or greater.

Suitable cover substrates may exhibit an elastic modulus (or Young's modulus) in the range from about 30 GPa to about 120 GPa. In some instances, the elastic modulus of the substrate may be in the range from about 30 GPa to about 110 GPa, from about 30 GPa to about 100 GPa, from about 30 GPa to about 90 GPa, from about 30 GPa to about 80 GPa, from about 30 GPa to about 70 GPa, from about 40 GPa to about 120 GPa, from about 50 GPa to about 120 GPa, from about 60 GPa to about 120 GPa, from about 70 GPa to about 120 GPa, and all ranges and sub-ranges therebetween.

In one or more embodiments, the cover substrates may include an amorphous substrate, which may include a glass article. The glass article may be strengthened or non-strengthened. Examples of suitable glass composition families used to form the glass articles include soda lime glass, alkali aluminosilicate glass, alkali containing borosilicate glass and alkali aluminoborosilicate glass. In one or more alternative embodiments, the cover substrate may include crystalline substrates such as glass ceramic article (which may be strengthened or non-strengthened) or may include a single crystal structure, such as sapphire. In one or more specific embodiments, the cover substrate includes an amorphous base (e.g., glass) and a crystalline cladding (e.g., sapphire layer, a polycrystalline alumina layer and/or or a spinel ($MgAl_2O_4$) layer).

The cover substrate may be substantially sheet-like, although other embodiments may utilize a curved or otherwise shaped or sculpted substrate. The cover substrate may be substantially optically clear, transparent and free from light scattering. In such embodiments, the cover substrate may exhibit an average light transmission over the optical wavelength regime of about 85% or greater, about 86% or greater, about 87% or greater, about 88% or greater, about 89% or greater, about 90% or greater, about 91% or greater or about 92% or greater. In one or more alternative embodiments, the cover substrate may be opaque or exhibit an average light transmission over the optical wavelength regime of less than about 10%, less than about 9%, less than about 8%, less than about 7%, less than about 6%, less than about 5%, less than about 4%, less than about 3%, less than about 2%, less than about 1%, or less than about 0%. In some embodiments, these light transmittance values are total transmittance values (taking into account transmittance through both major surfaces of the substrate) The substrate 110 may optionally exhibit a color, such as white, black, red, blue, green, yellow, orange etc.

The cover substrate assembly also includes a reversible support attached to at least a portion the second major surface of the cover substrate. The reversible support is capable of dynamically bending or dynamically bends the cover substrate along the bend axis in a cycle from a first radius of curvature to a second radius of curvature and from the second radius of curvature to the first radius of curvature. This sequence is described herein as a cycle. In one or more embodiments, the reversible support is capable of dynamically bending or dynamically bends the cover substrate along the bend axis from having a flat shape to a concave shape and back to a flat shape (from the perspective of the first major surface). In one or more embodiments, the reversible support is capable of dynamically bending or dynamically bends the cover substrate along the bend axis from having a flat shape to a convex shape and then back to a flat shape (from the perspective of the first major surface). In one or more embodiments, the reversible support is capable of dynamically bending or dynamically bends the cover substrate along the bend axis from having a concave shape to a convex shape and back to a concave shape (from the perspective of the first major surface). In one or more embodiments, the reversible support is capable of dynamically bending or dynamically bends the cover substrate along the bend axis from having a convex shape to a concave shape and back to a convex shape (from the perspective of the first major surface).

In one or more embodiments, the first radius of curvature is greater than the second radius of curvature. In one or more embodiments, the first radius of curvature is 2 times, 3 times, 4 times or 5 times greater than the second radius of curvature. In one or more specific embodiments, the first radius of curvature is in a range from about 2500 mm to infinity (or a radius of curvature in which the cover substrate is in a flat configuration), or from about 10,000 mm to infinity. In one or more embodiments, the second radius of curvature is from about 20 mm to about 10,000 mm, from about 20 mm to about 9,000 mm, from about 20 mm to about 8,000 mm, from about 20 mm to about 7,000 mm, from about 20 mm to about 6,000 mm, from about 20 mm to about 5,000 mm, from about 20 mm to about 4,000 mm, from about 20 mm to about 3,000 mm, from about 20 mm to about 2,000 mm, from about 20 mm to about 1,000 mm, from about 20 mm to about 750 mm, from about 20 mm to about 500 mm from about 20 mm to about 250 mm, from about 50 mm to about 10,000 mm, from about 75 mm to about 10,000 mm, from about 100 mm to about 10,000 mm, from about 200 mm to about 10,000 mm, from about 300 mm to about 10,000 mm, from about 400 mm to about 10,000 mm, from about 500 mm to about 10,000 mm, from about 600 mm to about 10,000 mm, from about 700 mm to about 10,000 mm, from about 800 mm to about 10,000 mm, from about 900 mm to about 10,000 mm, from about 1,000 mm to about 10,000 mm, from about 1,100 mm to about 10,000 mm, from about 1,200 mm to about 10,000 mm, from about 1,300 mm to about 10,000 mm, from about 1,400 mm to about 10,000 mm, from about 1,500 mm to about 10,000 mm, from about 1,600 mm to about 10,000 mm, from about 1,700 mm to about 10,000 mm, from about 1,800 mm to about 10,000 mm, from about 1,900 mm to about 10,000 mm, from about 2,000 mm to about 10,000 mm, from about 2,100 mm to about 10,000 mm, from about 2,200 mm to about 10,000 mm, from about 2,300 mm to about 10,000 mm, from about 2,400 mm to about 10,000 mm, from about 2,500 mm to about 10,000 mm, from about 3,000 mm to about 10,000 mm, from about 3,500 mm to about 10,000 mm, from about 4,000 mm to about 10,000 mm, from about 5,000 mm to about 10,000 mm, from about 7,500 mm to about 10,000 mm, from about 20 mm to about 1,000 mm, or from about 400 mm to about 10,000 mm.

In one or more embodiments in which the first radius of curvature is about 10,000 mm or less, the cover substrate has a curvature and is then dynamically bent along the bend axis. In one or more embodiments, the cover substrate comprises a cold-bent cover substrate. As used herein, the terms "cold-bent," or "cold-bending" refers to curving the cover substrate at a cold-bend temperature which is less than the softening point of the glass. Often, the cold-bend temperature is room temperature. The term "cold-bendable" refers to the capability of a cover substrate to be cold-bent. In one or more embodiments the cold-bent cover substrate may comprise a glass article or glass ceramic article, which may optionally be strengthened. In more embodiments, a feature of a cold-bent cover substrate is asymmetric surface compressive stress between the first major surface 121 and the second major surface 122. In one or more embodiments, prior to the cold-bending process or being cold-bent, the respective compressive stresses in the first major surface 121 and the second major surface 122 of the cover substrate are substantially equal. In one or more embodiments in which the cover substrate is unstrengthened, the first major surface 121 and the second major surface 122 exhibit no appreciable compressive stress (CS), prior to cold-bending. In one or more embodiments in which the cover substrate is strengthened (as described herein), the first major surface 121 and the second major surface 122 exhibit substantially equal compressive stress with respect to one another, prior to cold-bending. In one or more embodiments, after cold-bending, the CS on the surface having a concave shape after cold-bending increases, while the CS on the surface having a convex shape after cold-bending decreases. In other words, the CS on the concave surface is greater after cold-bending than before cold-bending. Without being bound by theory, the cold-bending process increases the CS of the cover substrate being shaped to compensate for tensile stresses imparted during cold-bending. In one or more embodiments, the cold-bending process causes the concave surface to experience compressive stresses, while the surface forming a convex shape after cold-bending experiences tensile stresses. The tensile stress experienced by the convex surface following cold-bending results in a net decrease in surface compressive stress, such that the compressive stress in convex surface of a strengthened cover substrate following cold-bending is less than the compressive stress on the same surface when the cover substrate is flat.

In one or more embodiments, the cover substrate may be a hot-formed glass article, which is permanently curved and the first major surface and the second major surface have the same CS.

In one or more embodiments, the cover substrate has a thickness (t) that is about 1.5 mm or less. In one or embodiments, the cover substrate has a thickness (t) that is greater than about 0.125 mm (e.g., about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, about 0.13 mm or greater, For example, the thickness may be in a range from about 0.01 mm to about 1.5 mm, 0.02 mm to about 1.5 mm, 0.03 mm to about 1.5 mm, 0.04 mm to about 1.5 mm, 0.05 mm to about 1.5 mm, 0.06 mm to about 1.5 mm, 0.07 mm to about 1.5 mm, 0.08 mm to about 1.5 mm, 0.09 mm to about 1.5 mm, 0.1 mm to about 1.5 mm, from about 0.15 mm to about 1.5 mm, from about 0.2 mm to about 1.5 mm, from about 0.25 mm to about 1.5 mm, from about 0.3 mm to about 1.5 mm, from about 0.35 mm to about 1.5 mm, from about 0.4 mm to about 1.5 mm, from about 0.45 mm to about 1.5 mm, from about 0.5 mm to about 1.5 mm, from about 0.55 mm to about 1.5 mm, from about 0.6 mm to about 1.5 mm, from about 0.65 mm to about 1.5 mm, from about 0.7 mm to about 1.5 mm, from about 0.01 mm to about 1.4 mm, from about 0.01 mm to about 1.3 mm, from about 0.01 mm to about 1.2 mm, from about 0.01 mm to about 1.1 mm, from about 0.01 mm to about 1.05 mm, from about 0.01 mm to about 1 mm, from about 0.01 mm to about 0.95 mm, from about 0.01 mm to about 0.9 mm, from about 0.01 mm to about 0.85 mm, from about 0.01 mm to about 0.8 mm, from about 0.01 mm to about 0.75 mm, from about 0.01 mm to about 0.7 mm, from about 0.01 mm to about 0.65 mm, from about 0.01 mm to about 0.6 mm, from about 0.01 mm to about 0.55 mm, from about 0.01 mm to about 0.5 mm, from about 0.01 mm to about 0.4 mm, from about 0.01 mm to about 0.3 mm, from about 0.01 mm to about 0.2 mm, from about 0.01 mm to about 0.1 mm, from about 0.04 mm to about 0.07 mm, from about 0.1 mm to about 1.4 mm, from about 0.1 mm to about 1.3 mm, from about 0.1 mm to about 1.2 mm, from about 0.1 mm to about 1.1 mm, from about 0.1 mm to about 1.05 mm, from about 0.1 mm to about 1 mm, from about 0.1 mm to about 0.95 mm, from about 0.1 mm to about 0.9 mm, from about 0.1 mm to about 0.85 mm, from about 0.1 mm to about 0.8 mm, from about 0.1 mm to about 0.75 mm, from about 0.1 mm to about 0.7 mm, from about 0.1 mm to about 0.65 mm, from about 0.1 mm to about 0.6 mm, from about 0.1 mm to about 0.55 mm, from about 0.1 mm to about 0.5 mm, from about 0.1 mm to about 0.4 mm, or from about 0.3 mm to about 0.7 mm.

In one or more embodiments, the thickness of the cover substrate is substantially uniform in that it the bend axis has substantially the same thickness as other portions of the cover substrate. For example, the thickness of the cover substrate does not vary by more than ±10%, 5% or 2% across the total surface area of the first major surface, the second major surface or both the first and second major surfaces. In one or more embodiments, the thickness is substantially constant (within ±1% of the average thickness) across 90%, 95% or 99% of the total surface area of the first major surface, the second major surface or both the first and second major surfaces.

In one or more embodiments, the cover substrate has a width (W) in a range from about 5 cm to about 250 cm, from about 10 cm to about 250 cm, from about 15 cm to about 250 cm, from about 20 cm to about 250 cm, from about 25 cm to about 250 cm, from about 30 cm to about 250 cm, from about 35 cm to about 250 cm, from about 40 cm to about 250 cm, from about 45 cm to about 250 cm, from about 50 cm to about 250 cm, from about 55 cm to about 250 cm, from about 60 cm to about 250 cm, from about 65 cm to about 250 cm, from about 70 cm to about 250 cm, from about 75 cm to about 250 cm, from about 80 cm to about 250 cm, from about 85 cm to about 250 cm, from about 90 cm to about 250 cm, from about 95 cm to about 250 cm, from about 100 cm to about 250 cm, from about 110 cm to about 250 cm, from about 120 cm to about 250 cm, from about 130 cm to about 250 cm, from about 140 cm to about 250 cm, from about 150 cm to about 250 cm, from about 5 cm to about 240 cm, from about 5 cm to about 230 cm, from about 5 cm to about 220 cm, from about 5 cm to about 210 cm, from about 5 cm to about 200 cm, from about 5 cm to about 190 cm, from about 5 cm to about 180 cm, from about 5 cm to about 170 cm, from about 5 cm to about 160 cm, from about 5 cm to about 150 cm, from about 5 cm to about 140 cm, from about 5 cm to about 130 cm, from about 5 cm to about 120 cm, from about 5 cm to about 110 cm, from about 5 cm to about 110 cm, from about 5 cm to about 100 cm, from about 5 cm to about 90 cm, from about 5 cm to about 80 cm, or from about 5 cm to about 75 cm.

In one or more embodiments, the cover substrate has a length (L) in a range from about 5 cm to about 250 cm, from about 10 cm to about 250 cm, from about 15 cm to about 250 cm, from about 20 cm to about 250 cm, from about 25 cm to about 250 cm, from about 30 cm to about 250 cm, from about 35 cm to about 250 cm, from about 40 cm to about 250 cm, from about 45 cm to about 250 cm, from about 50 cm to about 250 cm, from about 55 cm to about 250 cm, from about 60 cm to about 250 cm, from about 65 cm to about 250 cm, from about 70 cm to about 250 cm, from about 75 cm to about 250 cm, from about 80 cm to about 250 cm, from about 85 cm to about 250 cm, from about 90 cm to about 250 cm, from about 95 cm to about 250 cm, from about 100 cm to about 250 cm, from about 110 cm to about 250 cm, from about 120 cm to about 250 cm, from about 130 cm to about 250 cm, from about 140 cm to about 250 cm, from about 150 cm to about 250 cm, from about 5 cm to about 240 cm, from about 5 cm to about 230 cm, from about 5 cm to about 220 cm, from about 5 cm to about 210 cm, from about 5 cm to about 200 cm, from about 5 cm to about 190 cm, from about 5 cm to about 180 cm, from about 5 cm to about 170 cm, from about 5 cm to about 160 cm, from about 5 cm to about 150 cm, from about 5 cm to about 140 cm, from about 5 cm to about 130 cm, from about 5 cm to about 120 cm, from about 5 cm to about 110 cm, from about 5 cm to about 110 cm, from about 5 cm to about 100 cm, from about 5 cm to about 90 cm, from about 5 cm to about 80 cm, or from about 5 cm to about 75 cm.

In one or more embodiments, the cover substrate includes a glass article or glass ceramic article that is strengthened. In one or more embodiments, the cover glass has a compressive stress (CS) region that extends from one or both major surfaces 121, 122, to a first depth of compression (DOC). The CS region includes a maximum CS magnitude ($CS_{max}$). The glass article or glass ceramic has a CT region disposed in the central region that extends from the DOC to an opposing CS region. The CT region defines a maximum CT magnitude (CTmax). The CS region and the CT region define a stress profile that extends along the thickness of the glass article or glass ceramic.

In one or more embodiments, the glass article or glass ceramic article may be strengthened mechanically by utilizing a mismatch of the coefficient of thermal expansion between portions of the article to create a compressive stress region and a central region exhibiting a tensile stress. In some embodiments, the cover glass may be strengthened thermally by heating the glass to a temperature above the glass transition point and then rapidly quenching.

In one or more embodiments, the glass article or glass ceramic article may be chemically strengthening by ion exchange. In the ion exchange process, ions at or near the surface of the glass article or glass ceramic article are replaced by—or exchanged with—larger ions having the same valence or oxidation state. In those embodiments in which the glass article or glass ceramic article comprises an alkali aluminosilicate glass, ions in the surface layer of the article and the larger ions are monovalent alkali metal cations, such as Li+, Na+, K+, Rb+, and Cs+. Alternatively, monovalent cations in the surface layer may be replaced with monovalent cations other than alkali metal cations, such as Ag+ or the like. In such embodiments, the monovalent ions (or cations) exchanged into the glass article or glass ceramic article generate a stress.

Ion exchange processes are typically carried out by immersing a glass article or glass ceramic article in one or more molten salt baths containing the larger ions to be exchanged with the smaller ions in the glass article or glass ceramic article. It should be noted that aqueous salt baths may also be utilized. In addition, the composition of the bath(s) may include more than one type of larger ion (e.g., Na+ and K+) or a single larger ion. It will be appreciated by those skilled in the art that parameters for the ion exchange process, including, but not limited to, bath composition and temperature, immersion time, the number of immersions of the glass article or glass ceramic article in a salt bath (or baths), use of multiple salt baths, additional steps such as annealing, washing, and the like, are generally determined by the composition of the glass article or glass ceramic article (including the structure of the article and any crystalline phases present) and the desired CS, DOC and CT values of the glass article or glass ceramic article that results from strengthening. Exemplary molten bath composition may include nitrates, sulfates, and chlorides of the larger alkali metal ion. Typical nitrates include KNO3, NaNO3, LiNO3, NaSO4 and combinations thereof. The temperature of the molten salt bath typically is in a range from about 380° C. up to about 450° C., while immersion times range from about 15 minutes up to about 100 hours depending on glass article or glass ceramic article thickness, bath temperature and glass (or monovalent ion) diffusivity. However, temperatures and immersion times different from those described above may also be used.

In one or more embodiments, the glass article or glass ceramic article may be immersed in a molten salt bath of 100% NaNO3, 100% KNO3, or a combination of NaNO3 and KNO3 having a temperature from about 370° C. to about 480° C. In some embodiments, the glass article or glass ceramic article may be immersed in a molten mixed salt bath including from about 1% to about 99% KNO3 and from about 1% to about 99% NaNO3. In one or more embodiments, the glass article or glass ceramic article may be immersed in a second bath, after immersion in a first bath. The first and second baths may have different compositions and/or temperatures from one another. The immersion times in the first and second baths may vary. For example, immersion in the first bath may be longer than the immersion in the second bath.

In one or more embodiments, the glass article or glass ceramic article may be immersed in a molten, mixed salt bath including NaNO3 and KNO3 (e.g., 49%/51%, 50%/50%, 51%/49%) having a temperature less than about 420° C. (e.g., about 400° C. or about 380° C.). for less than about 5 hours, or even about 4 hours or less. In one or more embodiments, the cover glass is immersed in a first mixed molten salt bath (e.g., 75% KNO3/25% NaNO3) having a temperature of 430° C. for 8 hours, and then immersed in a second pure molten salt bath of KNO3 having a lower temperature than the first mixed molten salt bath for a shorter duration (e.g., about 4 hours). In one or more embodiments, the glass article or glass ceramic article may be chemically strengthened by immersing in a first bath having a composition of 75% $KNO_3$ and 25% $NaNO_3$ and bath temperature of 430° C. for 8 hours, followed by immersing in a second bath having a composition of 100% KNO3 and bath temperature of 390° C. for 4 hours.

Ion exchange conditions can be tailored to provide a "spike" or to increase the slope of the stress profile at or near the surface of the resulting glass article or glass ceramic article. The spike may result in a greater surface CS value. This spike can be achieved by single bath or multiple baths, with the bath(s) having a single composition or mixed composition, due to the unique properties of the glass compositions used in the glass article or glass ceramic article described herein.

In one or more embodiments, where more than one monovalent ion is exchanged into the glass article or glass ceramic article, the different monovalent ions may exchange to different depths within the glass article or glass ceramic article (and generate different magnitudes stresses within the glass article or glass ceramic article at different depths). The resulting relative depths of the stress-generating ions can be determined and cause different characteristics of the stress profile.

In one or more embodiments, the glass article or glass ceramic article has a CSmax that is about 900 MPa or greater, about 920 MPa or greater, about 940 MPa or greater, about 950 MPa or greater, about 960 MPa or greater, about 980 MPa or greater, about 1,000 MPa or greater, about 1,020 MPa or greater, about 1,040 MPa or greater, about 1,050 MPa or greater, about 1,060 MPa or greater, about 1,080 MPa or greater, about 1,100 MPa or greater, about 1,120 MPa or greater, about 1,140 MPa or greater, about 1,150 MPa or greater, about 1,160 MPa or greater, about 1,180 MPa or greater, about 1,200 MPa or greater, about 1,220 MPa or greater, about 1,240 MPa or greater, about 1,250 MPa or greater, about 1,260 MPa or greater, about 1,280 MPa or greater, or about 1,300 MPa or greater. In one or more embodiments, the CSmax is in a range from about 900 MPa to about 1,500 MPa, from about 920 MPa to about 1,500 MPa, from about 940 MPa to about 1,500 MPa, from about 950 MPa to about 1,500 MPa, from about 960 MPa to about 1,500 MPa, from about 980 MPa to about 1,500 MPa, from about 1,000 MPa to about 1,500 MPa, from about 1,020 MPa to about 1,500 MPa, from about 1,040 MPa to about 1,500 MPa, from about 1,050 MPa to about 1,500 MPa, from about 1,060 MPa to about 1,500 MPa, from about 1,080 MPa to about 1,500 MPa, from about 1,100 MPa to about 1,500 MPa, from about 1,120 MPa to about 1,500 MPa, from about 1,140 MPa to about 1,500 MPa, from about 1,150 MPa to about 1,500 MPa, from about 1,160 MPa to about 1,500 MPa, from about 1,180 MPa to about 1,500 MPa, from about 1,200 MPa to about 1,500 MPa, from about 1,220 MPa to about 1,500 MPa, from about 1,240 MPa to about 1,500 MPa, from about 1,250 MPa to about 1,500 MPa, from about 1,260 MPa to about 1,500 MPa, from about 1,280 MPa to about 1,500 MPa, from about 1,300 MPa to about 1,500 MPa, from about 900 MPa to about 1,480 MPa, from about 900 MPa to about 1,460 MPa, from about 900 MPa to about 1,450 MPa, from about 900 MPa to about 1,440 MPa, from about 900 MPa to about 1,420 MPa, from about 900 MPa to about 1,400 MPa, from about 900 MPa to about 1,380 MPa, from about 900 MPa to about 1,360 MPa, from about 900 MPa to about 1,350 MPa, from about 900 MPa to about 1,340 MPa, from about 900 MPa to about 1,320 MPa, from about 900 MPa to about 1,300 MPa, from about 900 MPa to about 1,280 MPa, from about 900 MPa to about 1,260 MPa, from about 900 MPa to about 1,250 MPa, from about 900 MPa to about 1,240 MPa, from about 900 MPa to about 1,220 MPa, from about 900 MPa to about 1,210 MPa, from about 900 MPa to about 1,200 MPa, from about 900 MPa to about 1,180 MPa, from about 900 MPa to about 1,160 MPa, from about 900 MPa to about 1,150 MPa, from about 900 MPa to about 1,140 MPa, from about 900 MPa to about 1,120 MPa, from about 900 MPa to about 1,100 MPa, from about 900 MPa to about 1,080 MPa, from about 900 MPa to about 1,060 MPa, from about 900 MPa to about 1,050 MPa, or from about 950 MPa to about 1,050 MPa, or from about 1,000 MPa to about 1,050 MPa. CSmax may be measured at a major surface or may be found at a depth from the major surface within the CS region.

In one or more embodiments, the glass article or glass ceramic article has a stress profile with a CS magnitude of 800 MPa or greater at a depth within the glass article or glass ceramic article of about 10 micrometers from the first major surface 102 ($CS_{10}$). In one or more embodiments, the $CS_{10}$ is about 810 MPa or greater, about 820 MPa or greater, about 830 MPa or greater, about 840 MPa or greater, about 850 MPa or greater, about 860 MPa or greater, about 870 MPa or greater, about 880 MPa or greater, about 890 MPa or greater, or about 900 MPa or greater. In one or more embodiments, the $CS_{10}$ is in a range from about 800 MPa to about 1,000 MPa, from about 825 MPa to about 1,000 MPa, from about 850 MPa to about 1,000 MPa, from about 875 MPa to about 1,000 MPa, from about 900 MPa to about 1,000 MPa, from about 925 MPa to about 1,000 MPa, from about 950 MPa to about 1,000 MPa, from about 800 MPa to about 975 MPa, from about 800 MPa to about 950 MPa, from about 800 MPa to about 925 MPa, from about 800 MPa to about 900 MPa, from about 800 MPa to about 875 MPa, or from about 800 MPa to about 850 MPa.

In one or more embodiments, the glass article or glass ceramic article has a stress profile with a CS magnitude of 700 MPa or greater, or about 750 MPa or greater at a depth within the glass article of about 5 micrometers from the first major surface 102 ($CS_5$). In one or more embodiments, the $CS_5$ is about 760 MPa or greater, about 770 MPa or greater, about 775 MPa or greater, about 780 MPa or greater, about 790 MPa or greater, about 800 MPa or greater, about 810 MPa or greater, about 820 MPa or greater, about 825 MPa or greater, or about 830 MPa or greater. In one or more embodiments, the $CS_5$ is in a range from about 700 MPa to about 900 MPa, from about 725 MPa to about 900 MPa, from about 750 MPa to about 900 MPa, from about 775 MPa to about 900 MPa, from about 800 MPa to about 900 MPa, from about 825 MPa to about 900 MPa, from about 850 MPa to about 900 MPa, from about 700 MPa to about 875 MPa, from about 700 MPa to about 850 MPa, from about 700 MPa to about 825 MPa, from about 700 MPa to about 800 MPa, from about 700 MPa to about 775 MPa, from about 750 to about 800 MPa, from about 750 MPa to about 850 MPa, or from about 700 MPa to about 750 MPa.

In one or more embodiments, the glass article or glass ceramic article has a stress profile with a $CT_{max}$ that is present or located at a depth within the glass article or glass ceramic article from the first major surface in a range from about 0.25 t to about 0.75 t. In one or more embodiments, $CT_{max}$ is present or located at a depth in a range from about 0.25 t to about 0.74 t, from about 0.25 t to about 0.72 t, from about 0.25 t to about 0.70 t, from about 0.25 t to about 0.68 t, from about 0.25 t to about 0.66 t, from about 0.25 t to about 0.65 t, from about 0.25 t to about 0.62 t, from about 0.25 t to about 0.60 t, from about 0.25 t to about 0.58 t, from about 0.25 t to about 0.56 t, from about 0.25 t to about 0.55 t, from about 0.25 t to about 0.54 t, from about 0.25 t to about 0.52 t, from about 0.25 t to about 0.50 t, from about 0.26 t to about 0.75 t, from about 0.28 t to about 0.75 t, from about 0.30 t to about 0.75 t, from about 0.32 t to about 0.75 t, from about 0.34 t to about 0.75 t, from about 0.35 t to about 0.75 t, from about 0.36 t to about 0.75 t, from about 0.38 t to about 0.75 t, from about 0.40 t to about 0.75 t, from about 0.42 t to about 0.75 t, from about 0.44 t to about 0.75 t, from about 0.45 t to about 0.75 t, from about 0.46 t to about 0.75 t, from about 0.48 t to about 0.50 t, from about 0.30 t to about 0.70 t, from about 0.35 t to about 0.65 t, from about 0.4 t to about 0.6 t, or from about 0.45 t to about 0.55 t. In one or more embodiments, the foregoing ranges for the location of CTmax is present when the glass article or glass ceramic article is in a substantially flat configuration (e.g., the cover glass has a radius of curvature of greater than about 5000 mm, or greater than about 10,000 mm).

In one or more embodiments, the $CT_{max}$ magnitude is about 80 MPa or less, about 78 MPa or less, about 76 MPa or less, about 75 MPa or less, about 74 MPa or less, about 72 MPa or less, about 70 MPa or less, about 68 MPa or less, about 66 MPa or less, about 65 MPa or less, about 64 MPa or less, about 62 MPa or less, about 60 MPa or less, about 58 MPa or less, about 56 MPa or less, about 55 MPa or less, about 54 MPa or less, about 52 MPa or less, or about 50 MPa or less. In one or more embodiments, the $CT_{max}$ magnitude is in a range from about 40 MPa to about 80 MPa, from about 45 MPa to about 80 MPa, from about 50 MPa to about 80 MPa, from about 55 MPa to about 80 MPa, from about 60 MPa to about 80 MPa, from about 65 MPa to about 80 MPa, from about 70 MPa to about 80 MPa, from about 40 MPa to about 75 MPa, from about 40 MPa to about 70 MPa, from about 40 MPa to about 65 MPa, from about 40 MPa to about 60 MPa, from about 40 MPa to about 55 MPa, or from about 40 MPa to about 50 MPa. In one or more embodiments, the foregoing ranges the magnitude of CTmax is present when the glass article or glass ceramic article is in a substantially flat configuration (e.g., the glass article or glass ceramic article has a radius of curvature of greater than about 5000 mm, or greater than about 10,000 mm).

In one or more embodiments, a portion of the stress profile has a parabolic-like shape. In some embodiments, the stress profile is free of a flat stress (i.e., compressive or tensile) portion or a portion that exhibits a substantially constant stress (i.e., compressive or tensile). In some embodiments, the CT region exhibits a stress profile that is substantially free of a flat stress or free of a substantially constant stress. In one or more embodiments, the stress profile is substantially free of any linear segments that extend in a depth direction or along at least a portion of the thickness t of the cover glass. In other words, the stress profile is substantially continuously increasing or decreasing along the thickness t. In some embodiments, the stress profile is substantially free of any linear segments in a depth direction having a length of about 10 micrometers or more, about 50 micrometers or more, or about 100 micrometers or more, or about 200 micrometers or more. As used herein, the term "linear" refers to a slope having a magnitude of less than about 5 MPa/micrometer, or less than about 2 MPa/micrometer along the linear segment. In some embodiments, one or more portions of the stress profile that are substantially free of any linear segments in a depth direction are present at depths within the cover glass of about 5 micrometers or greater (e.g., 10 micrometers or greater, or 15 micrometers or greater) from either one or both the first surface or the second surface. For example, along a depth of about 0 micrometers to less than about 5 micrometers from the first surface, the stress profile may include linear segments, but from a depth of about 5 micrometers or greater from the first surface, the stress profile may be substantially free of linear segments.

In one or more embodiments, all points of the CT region within 0.1 t, 0.15 t, 0.2 t, or 0.25 t from the depth of CTmax comprise a tangent having a non-zero slope. In one or more embodiments, all such points comprise a tangent having a slope that is greater than about 0.5 MPa/micrometer in magnitude, greater than about 0.75 MPa/micrometer in magnitude, greater than about 1 MPa/micrometer in magnitude, greater than about 1.5 MPa/micrometer in magnitude, or greater about 2 MPa/micrometer in magnitude than, or greater than about 0.5 MPa/micrometer in magnitude.

In one or more embodiments, all points of the stress profile at a depth from about 0.12 t or greater (e.g., from about 0.12 t to about 0.24 t, from about 0.14 t to about 0.24 t, from about 0.15 t to about 0.24 t, from about 0.16 t to about 0.24 t, from about 0.18 t to about 0.24 t, from about 0.12 t to about 0.22 t, from about 0.12 t to about 0.2 t, from about 0.12 t to about 0.18 t, from about 0.12 t to about 0.16 t, from about 0.12 t to about 0.15 t, from about 0.12 t to about 0.14 t, or from about 0.15 t to about 0.2 t) comprise a tangent having a non-zero slope.

In one or more embodiments, the glass article or glass ceramic article may be described in terms of the shape of the stress profile along at least a portion of the CT region (112 in FIG. 2). For example, in some embodiments, the stress profile along a substantial portion or the entire CT region may be approximated by equation. In some embodiments, the stress profile along the CT region may be approximated by equation (1):

$$\text{Stress}(x) = CT\max - (((CT\max \cdot (n+1))/0.5^n) \cdot |(x/t) - 0.5|^n) \quad (1)$$

In equation (1), the stress (x) is the stress value at position x. Here the stress is positive (tension). CTmax is the maximum central tension as a positive value in MPa. The value x is position along the thickness (t) in micrometers, with a range from 0 to t; x=0 is one surface (102, in FIG. 2), x=0.5 t is the center of the glass article or glass ceramic article, stress(x)=CTmax, and x=t is the opposite surface (104, in FIG. 2). CTmax used in equation (1) may be in the range from about 40 MPa to about 80 MPa, and n is a fitting parameter from 1.5 to 5 (e.g., 2 to 4, 2 to 3 or 1.8 to 2.2) whereby n=2 can provide a parabolic stress profile, exponents that deviate from n=2 provide stress profiles with near parabolic stress profiles.

In one or more embodiments, the DOC of the glass article or glass ceramic article is about 0.2 t or less. For example, DOC may be about 0.18 t or less, about 0.18 t or less, about 0.16 t or less, about 0.15 t or less, about 0.14 t or less, about 0.12 t or less, about 0.1 t or less, about 0.08 t or less, about 0.06 t or less, about 0.05 t or less, about 0.04 t or less, or about 0.03 t or less. In one or more embodiments, DOC is in a range from about 0.02 t to about 0.2 t, from about 0.04 t to about 0.2 t, from about 0.05 t to about 0.2 t, from about 0.06 t to about 0.2 t, from about 0.08 t to about 0.2 t, from about 0.1 t to about 0.2 t, from about 0.12 t to about 0.2 t, from about 0.14 t to about 0.2 t, from about 0.15 t to about 0.2 t, from about 0.16 t to about 0.2 t, from about 0.02 t to about 0.18 t, from about 0.02 t to about 0.16 t, from about 0.02 t to about 0.15 t, from about 0.02 t to about 0.14 t, from about 0.02 t to about 0.12 t, from about 0.02 t to about 0.1 t, from about 0.02 t to about 0.08, from about 0.02 t to about 0.06 t, from about 0.02 t to about 0.05 t, from about 0.1 t to about 0.8 t, from about 0.12 t to about 0.16 t, or from about 0.14 t to about 0.17 t.

In one or more embodiments, the glass article or glass ceramic article has a DOL that is in a range from about 10 micrometers to about 50 micrometers, from about 12 micrometers to about 50 micrometers, from about 14 micrometers to about 50 micrometers, from about 15 micrometers to about 50 micrometers, from about 16 micrometers to about 50 micrometers, from about 18 micrometers to about 50 micrometers, from about 20 micrometers to about 50 micrometers, from about 22 micrometers to about 50 micrometers, from about 24 micrometers to about 50 micrometers, from about 25 micrometers to about 50 micrometers, from about 26 micrometers to about 50 micrometers, from about 28 micrometers to about 50 micrometers, from about 30 micrometers to about 50 micrometers, from about 10 micrometers to about 48 micrometers, from about 10 micrometers to about 46 micrometers, from about 10 micrometers to about 45 micrometers, from about 10 micrometers to about 44 micrometers, from about 10 micrometers to about 42 micrometers, from about 10 micrometers to about 40 micrometers, from about 10 micrometers to about 38 micrometers, from about 10 micrometers to about 36 micrometers, from about 10 micrometers to about 35 micrometers, from about 10 micrometers to about 34 micrometers, from about 10 micrometers to about 32 micrometers, from about 10 micrometers to about 30 micrometers, from about 10 micrometers to about 28 micrometers, from about 10 micrometers to about 26 micrometers, from about 10 micrometers to about 25 micrometers, from about 20 micrometers to about 40 micrometers, from about 25 micrometers to about 40 micrometers, from about 20 micrometers to about 35 micrometers, or from about 25 micrometers to about 35 micrometers. In one or more embodiments, at least a portion of the stress profile comprises a spike region 120 extending from the first major surface, a tail region 124 and a knee region 122 between the spike region and the tail region, as illustrated in FIG. 3. The spike region 120 is within the CS region of the stress profile. In one or more embodiments, wherein all points of the stress profile in the spike region comprise a tangent having a slope in magnitude that is in a range from about 15 MPa/micrometer to about 200 MPa/micrometer, from about 20 MPa/micrometer to about 200 MPa/micrometer, from about 25 MPa/micrometer to about 200 MPa/micrometer, from about 30 MPa/micrometer to about 200 MPa/micrometer, from about 35 MPa/micrometer to about 200 MPa/micrometer, from about 40 MPa/micrometer to about 200 MPa/micrometer, from about 45 MPa/micrometer to about 200 MPa/micrometer, from about 100 MPa/micrometer to about 200 MPa/micrometer, from about 150 MPa/micrometer to about 200 MPa/micrometer, from about 15 MPa/micrometer to about 190 MPa/micrometer, from about 15 MPa/micrometer to about 180 MPa/micrometer, from about 15 MPa/micrometer to about 170 MPa/micrometer, from about 15 MPa/micrometer to about 160 MPa/micrometer, from about 15 MPa/micrometer to about 150 MPa/micrometer, from about 15 MPa/micrometer to about 140 MPa/micrometer, from about 15 MPa/micrometer to about 130 MPa/micrometer, from about 15 MPa/micrometer to about 120 MPa/micrometer, from about 15 MPa/micrometer to about 100 MPa/micrometer, from about 15 MPa/micrometer to about 750 MPa/micrometer, from about 15 MPa/micrometer to about 50 MPa/micrometer, from about 50 MPa/micrometer to about 150 MPa/micrometer, or from about 75 MPa/micrometer to about 125 MPa/micrometer.

In one or more embodiments, and all points in the tail region comprise a tangent having a slope in magnitude that is in a range from about 0.01 MPa/micrometer to about 3 MPa/micrometer, from about 0.05 MPa/micrometer to about 3 MPa/micrometer, from about 0.1 MPa/micrometer to about 3 MPa/micrometer, from about 0.25 MPa/micrometer to about 3 MPa/micrometer, from about 0.5 MPa/micrometer to about 3 MPa/micrometer, from about 0.75 MPa/micrometer to about 3 MPa/micrometer, from about 1 MPa/micrometer to about 3 MPa/micrometer, from about 1.25 MPa/micrometer to about 3 MPa/micrometer, from about 1.5 MPa/micrometer to about 3 MPa/micrometer, from about 1.75 MPa/micrometer to about 3 MPa/micrometer, from about 2 MPa/micrometer to about 3 MPa/micrometer, from about 0.01 MPa/micrometer to about 2.9 MPa/micrometer, from about 0.01 MPa/micrometer to about 2.8 MPa/micrometer, from about 0.01 MPa/micrometer to about 2.75 MPa/micrometer, from about 0.01 MPa/micrometer to about 2.7 MPa/micrometer, from about 0.01 MPa/micrometer to about 2.6 MPa/micrometer, from about 0.01 MPa/micrometer to about 2.5 MPa/micrometer, from about 0.01 MPa/micrometer to about 2.4 MPa/micrometer, from about 0.01 MPa/micrometer to about 2.2 MPa/micrometer, from about 0.01 MPa/micrometer to about 2.1 MPa/micrometer, from about 0.01 MPa/micrometer to about 2 MPa/micrometer, from about 0.01 MPa/micrometer to about 1.75 MPa/micrometer, from about 0.01 MPa/micrometer to about 1.5 MPa/micrometer, from about 0.01 MPa/micrometer to about 1.25 MPa/micrometer, from about 0.01 MPa/micrometer to about 1 MPa/micrometer, from about 0.01 MPa/micrometer to about 0.75 MPa/micrometer, from about 0.01 MPa/micrometer to about 0.5 MPa/micrometer, from about 0.01 MPa/micrometer to about 0.25 MPa/micrometer, from about 0.1 MPa/micrometer to about 2 MPa/micrometer, from about 0.5 MPa/micrometer to about 2 MPa/micrometer, or from about 1 MPa/micrometer to about 3 MPa/micrometer.

In one or more embodiments, the CS magnitude within the spike region is in a range from about greater than 200 MPa to about 1,500 MPa. For example, the CS magnitude in the spike region may be in a range from about 250 MPa to about 1,500 MPa, from about 300 MPa to about 1,500 MPa, from about 350 MPa to about 1,500 MPa, from about 400 MPa to about 1,500 MPa, from about 450 MPa to about 1,500 MPa, from about 500 MPa to about 1,500 MPa, from about 550 MPa to about 1,500 MPa, from about 600 MPa to about 1,500 MPa, from about 750 MPa to about 1,500 MPa, from about 800 MPa to about 1,500 MPa, from about 850 MPa to about 1,500 MPa, from about 900 MPa to about 1,500 MPa, from about 950 MPa to about 1,500 MPa, from about 1,000 MPa to about 1,500 MPa, from about 1,050 MPa to about 1,500 MPa, from about 1,100 MPa to about 1,500 MPa, from about 1,200 MPa to about 1,500 MPa, from about 250 MPa to about 1,450 MPa, from about 250 MPa to about 1,400 MPa, from about 250 MPa to about 1,350 MPa, from about 250 MPa to about 1,300 MPa, from about 250 MPa to about 1,250 MPa, from about 250 MPa to about 1,200 MPa, from about 250 MPa to about 1,150 MPa, from about 250 MPa to about 1,100 MPa, from about 250 MPa to about 1,050 MPa, from about 250 MPa to about 1,000 MPa, from about 250 MPa to about 950 MPa, from about 250 MPa to about 90 MPa, from about 250 MPa to about 850 MPa, from about 250 MPa to about 800 MPa, from about 250 MPa to about 750 MPa, from about 250 MPa to about 700 MPa, from about 250 MPa to about 650 MPa, from about 250 MPa to about 600 MPa, from about 250 MPa to about 550 MPa, from about 250 MPa to about 500 MPa, from about 800 MPa to about 1,400 MPa, from about 900 MPa to about 1,300 MPa, from about 900 MPa to about 1,200 MPa, from about 900 MPa to about 1,100 MPa, or from about 900 MPa to about 1,050 MPa.

In one or more embodiments, the CS magnitude in the knee region is in a range from about 5 MPa to about 200 MPa, from about 10 MPa to about 200 MPa, from about 15 MPa to about 200 MPa, from about 20 MPa to about 200 MPa, from about 25 MPa to about 200 MPa, from about 30 MPa to about 200 MPa, from about 35 MPa to about 200 MPa, from about 40 MPa to about 200 MPa, from about 45 MPa to about 200 MPa, from about 50 MPa to about 200 MPa, from about 55 MPa to about 200 MPa, from about 60 MPa to about 200 MPa, from about 65 MPa to about 200 MPa, from about 75 MPa to about 200 MPa, from about 80 MPa to about 200 MPa, from about 90 MPa to about 200 MPa, from about 100 MPa to about 200 MPa, from about 125 MPa to about 200 MPa, from about 150 MPa to about 200 MPa, from about 5 MPa to about 190 MPa, from about 5 MPa to about 180 MPa, from about 5 MPa to about 175 MPa, from about 5 MPa to about 170 MPa, from about 5 MPa to about 160 MPa, from about 5 MPa to about 150

MPa, from about 5 MPa to about 140 MPa, from about 5 MPa to about 130 MPa, from about 5 MPa to about 125 MPa, from about 5 MPa to about 120 MPa, from about 5 MPa to about 110 MPa, from about 5 MPa to about 100 MPa, from about 5 MPa to about 75 MPa, from about 5 MPa to about 50 MPa, from about 5 MPa to about 25 MPa, or from about 10 MPa to about 100 MPa.

In one or more embodiments, the knee region of the stress profile extends from about 10 micrometers to about 50 micrometers from the first major surface. For example, the knee region of the stress profile extends from about 12 micrometers to about 50 micrometers, from about 14 micrometers to about 50 micrometers, from about 15 micrometers to about 50 micrometers, from about 16 micrometers to about 50 micrometers, from about 18 micrometers to about 50 micrometers, from about 20 micrometers to about 50 micrometers, from about 22 micrometers to about 50 micrometers, from about 24 micrometers to about 50 micrometers, from about 25 micrometers to about 50 micrometers, from about 26 micrometers to about 50 micrometers, from about 28 micrometers to about 50 micrometers, from about 30 micrometers to about 50 micrometers, from about 32 micrometers to about 50 micrometers, from about 34 micrometers to about 50 micrometers, from about 35 micrometers to about 50 micrometers, from about 36 micrometers to about 50 micrometers, from about 38 micrometers to about 50 micrometers, from about 40 micrometers to about 50 micrometers, from about 10 micrometers to about 48 micrometers, from about 10 micrometers to about 46 micrometers, from about 10 micrometers to about 45 micrometers, from about 10 micrometers to about 44 micrometers, from about 10 micrometers to about 42 micrometers, from about 10 micrometers to about 40 micrometers, from about 10 micrometers to about 38 micrometers, from about 10 micrometers to about 36 micrometers, from about 10 micrometers to about 35 micrometers, from about 10 micrometers to about 34 micrometers, from about 10 micrometers to about 32 micrometers, from about 10 micrometers to about 30 micrometers, from about 10 micrometers to about 28 micrometers, from about 10 micrometers to about 26 micrometers, from about 10 micrometers to about 25 micrometers, from about 10 micrometers to about 24 micrometers, from about 10 micrometers to about 22 micrometers, or from about 10 micrometers to about 20 micrometers, from the first major surface.

In one or more embodiments, the tail region extends from about the knee region to the depth of $CT_{max}$. In one or more embodiments, the tail region comprises one or both of a compressive stress tail region, and a tensile stress tail region.

In one or more embodiments, the either one of or both the first major surface 121 and the second major surface 122 of the cover substrate includes a surface treatment. The surface treatment may cover at least a portion of the first major surface 121 and the second major surface 122. Exemplary surface treatments include an easy-to-clean surface, an anti-glare surface, an anti-reflective surface, a haptic surface, and a decorative surface. In one or more embodiments, the at least a portion of the first major surface 121 and/or the second major surface 122 may include any one, any two or all three of an anti-glare surface, an anti-reflective surface, a haptic surface, and a decorative surface. For example, first major surface 121 may include an anti-glare surface and the second major surface 122 may include an anti-reflective surface. In another example, the first major surface 121 includes an anti-reflective surface and the second major 122 includes an anti-glare surface. In yet another example, the first major surface 121 comprises either one of or both the anti-glare surface and the anti-reflective surface, and the second major surface 122 includes the decorative surface.

The anti-glare surface may be formed using an etching process and may exhibit a transmission haze 20% or less (e.g., about 15% or less, about 10% or less, 5% or less). In one or more the anti-glare surface may have a distinctiveness of image (DOI) of about 80 or less. As used herein, the terms "transmission haze" and "haze" refer to the percentage of transmitted light scattered outside an angular cone of about 2.5° in accordance with ASTM procedure D1003. For an optically smooth surface, transmission haze is generally near zero. As used herein, the term "distinctness of image" is defined by method A of ASTM procedure D5767 (ASTM 5767), entitled "Standard Test Methods for Instrumental Measurements of Distinctness-of-Image Gloss of Coating Surfaces," the contents of which are incorporated herein by reference in their entirety. In accordance with method A of ASTM 5767, substrate reflectance factor measurements are made on the anti-glare surface at the specular viewing angle and at an angle slightly off the specular viewing angle. The values obtained from these measurements are combined to provide a DOI value. In particular, DOI is calculated according to the equation (2)

$$DOI = \left[1 - \frac{Ros}{Rs}\right] \times 100, \quad (2)$$

where Ros is the relative reflection intensity average between 0.2° and 0.4 away from the specular reflection direction, and Rs is the relative reflection intensity average in the specular direction (between +0.05° and −0.05°, centered around the specular reflection direction). If the input light source angle is +20° from the sample surface normal (as it is throughout this disclosure), and the surface normal to the sample is taken as 0°, then the measurement of specular reflected light Rs is taken as an average in the range of about −19.95° to −20.05°, and Ros is taken as the average reflected intensity in the range of about −20.2° to −20.4° (or from −19.6° to −19.8°, or an average of both of these two ranges). As used herein, DOI values should be directly interpreted as specifying a target ratio of Ros/Rs as defined herein. In some embodiments, the anti-glare surface has a reflected scattering profile such that >95% of the reflected optical power is contained within a cone of +/−10°, where the cone is centered around the specular reflection direction for any input angle.

The anti-glare surface may have a surface roughness (Ra) from about 10 nm to about 70 nm (e.g., from about 10 nm to about 68 nm, from about 10 nm to about 66 nm, from about 10 nm to about 65 nm, from about 10 nm to about 64 nm, from about 10 nm to about 62 nm, from about 10 nm to about 60 nm, from about 10 nm to about 55 nm, from about 10 nm to about 50 nm, from about 10 nm to about 45 nm, from about 10 nm to about 40 nm, from about 12 nm to about 70 nm, from about 14 nm to about 70 nm, from about 15 nm to about 70 nm, from about 16 nm to about 70 nm, from about 18 nm to about 70 nm, from about 20 nm to about 70 nm, from about 22 nm to about 70 nm, from about 24 nm to about 70 nm, from about 25 nm to about 70 nm, from about 26 nm to about 70 nm, from about 28 nm to about 70 nm, or from about 30 nm to about 70 nm. The anti-glare surface may include a textured surface with plurality of concave features having an opening facing outwardly from the surface. The opening may have an average cross-sectional dimension of about 30 micrometers or less (e.g., from about 2 micrometers to about 30 micrometers, from about 4 micrometers to about 30 micrometers, from about 5 micrometers to about 30 micrometers, from about 6 micrometers to about 30 micrometers, from about 8 micrometers to about 30 micrometers, from about 10 micrometers to about 30 micrometers, from about 12 micrometers to about 30 micrometers, from about 15 micrometers to about 30 micrometers, from about 2 micrometers to about 25 micrometers, from about 2 micrometers to about 20 micrometers, from about 2 micrometers to about 18 micrometers, from about 2 micrometers to about 16 micrometers, from about 2 micrometers to about 15 micrometers, from about 2 micrometers to about 14 micrometers, from about 2 micrometers to about 12 micrometers, or from about 8 micrometers to about 15 micrometers. In one or more embodiments, the anti-glare surface exhibits low sparkle (in terms of low pixel power deviation reference or PPDr) such as PPDr of about 6% or less, 4% or less, 3% or less, 2% or less, or about 1% or less. As used herein, the terms "pixel power deviation referenced" and "PPDr" refer to the quantitative measurement for display sparkle. Unless otherwise specified, PPDr is measured using a display arrangement that includes an edge-lit liquid crystal display screen (twisted nematic liquid crystal display) having a native sub-pixel pitch of 60 µm×180 µm and a sub-pixel opening window size of about 44 µm×about 142 µm. The front surface of the liquid crystal display screen had a glossy, anti-reflection type linear polarizer film. To determine PPDr of a display system or an anti-glare surface that forms a portion of a display system, a screen is placed in the focal region of an "eye-simulator" camera, which approximates the parameters of the eye of a human observer. As such, the camera system includes an aperture (or "pupil aperture") that is inserted into the optical path to adjust the collection angle of light, and thus approximate the aperture of the pupil of the human eye. In the PPDr measurements described herein, the iris diaphragm subtends an angle of 18 milliradians.

The anti-reflective surface may be formed by a multilayer coating stack formed from alternating layers of a high refractive index material and a low refractive index material. Such coatings stacks may include 6 layers or more. In one or more embodiment, the anti-reflective surface may exhibit a single-side average light reflectance of about 2% or less (e.g., about 1.5% or less, about 1% or less, about 0.75% or less, about 0.5% or less, or about 0.25% or less) over the optical wavelength regime in the range from about 400 nm to about 800 nm. The average reflectance is measured at an incident illumination angle greater than about 0 degrees to less than about 10 degrees.

The decorative surface may include any aesthetic design formed from a pigment (e.g., ink, paint and the like) and can include a wood-grain design, a brushed metal design, a graphic design, a portrait, or a logo. In one or more embodiments, the decorative surface exhibits a deadfront effect in which the decorative surface disguises or masks the underlying display from a viewer when the display is turned off but permits the display to be viewed when the display is turned on. The decorative surface may be printed onto the glass substrate. In one or more embodiments, the anti-glare surface includes an etched surface. In one or more embodiments, the anti-reflective surface includes a multi-layer coating. In one or more embodiments, the easy-to-clean surface includes an oleophobic coating that imparts anti-fingerprint properties. In one or more embodiments, the haptic surface includes a raised or recessed surface formed from depositing a polymer or glass material on the surface to provide a user with tactile feedback when touched.

In one or more embodiments, the surface treatment (i.e., the easy-to-clean surface, the anti-glare surface, the anti-reflective surface, the haptic surface and/or the decorative surface) is disposed on at least a portion of the periphery of the first and/or second major surface and the interior portion of such surface is substantially free of the surface treatment.

Figure 3A:
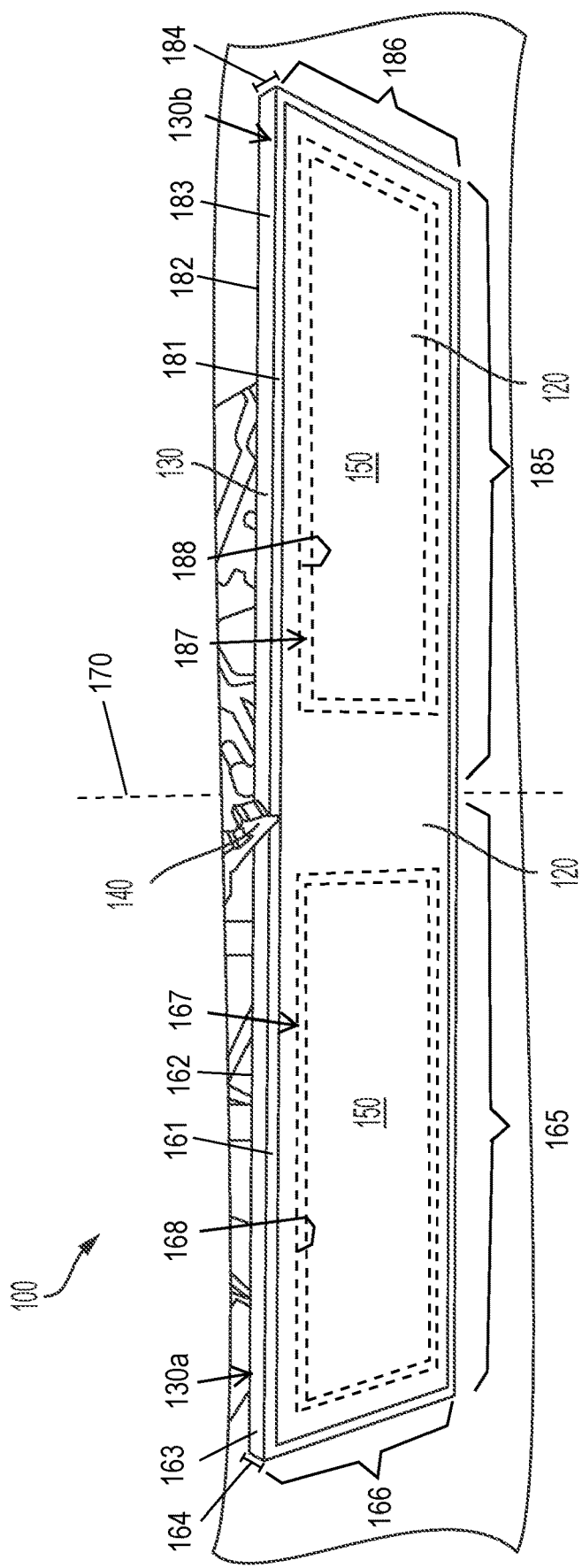
FIG. 3A is a front view of a dynamically bendable automotive interior display system with a reversible support, according to one or more embodiments.
Figure 3B:
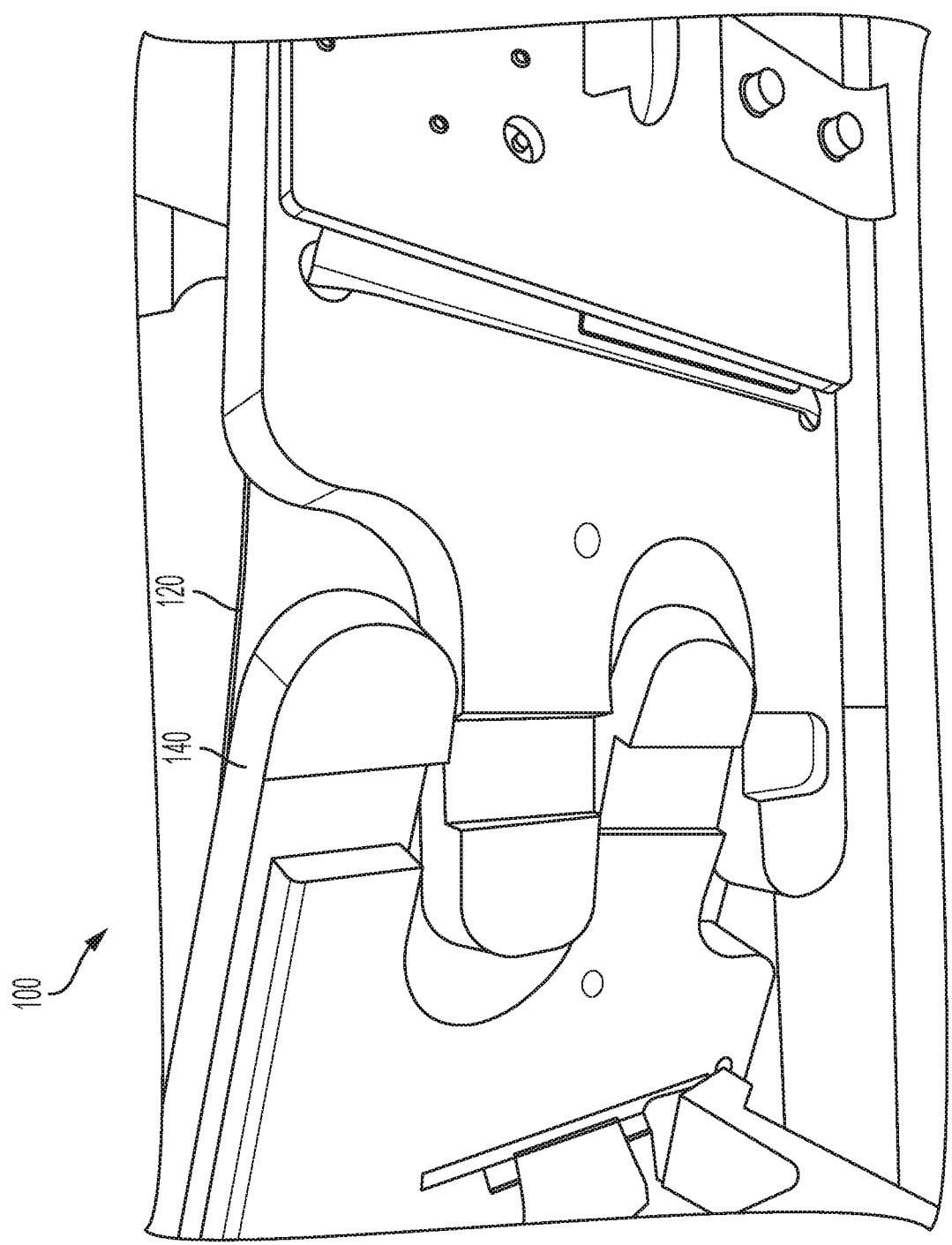
FIG. 3B is a back view of the system of FIG. 3A.

FIGS. 3A-3B show an embodiment of a dynamically bendable automotive interior display system 100, with a cover substrate 120 with a first major surface and a second major surface opposing the first major surface disposed over a display (not shown). The system 100 includes a reversible support 140 attached to the second major surface. The second major surface of the cover substrate is adjacent the display. The reversible support dynamically bends the cover substrate from a first radius of curvature (as shown in FIG. 3A) to a second radius of curvature (as shown in FIG. 3B) and then to the first radius of curvature.

Figure 4A:
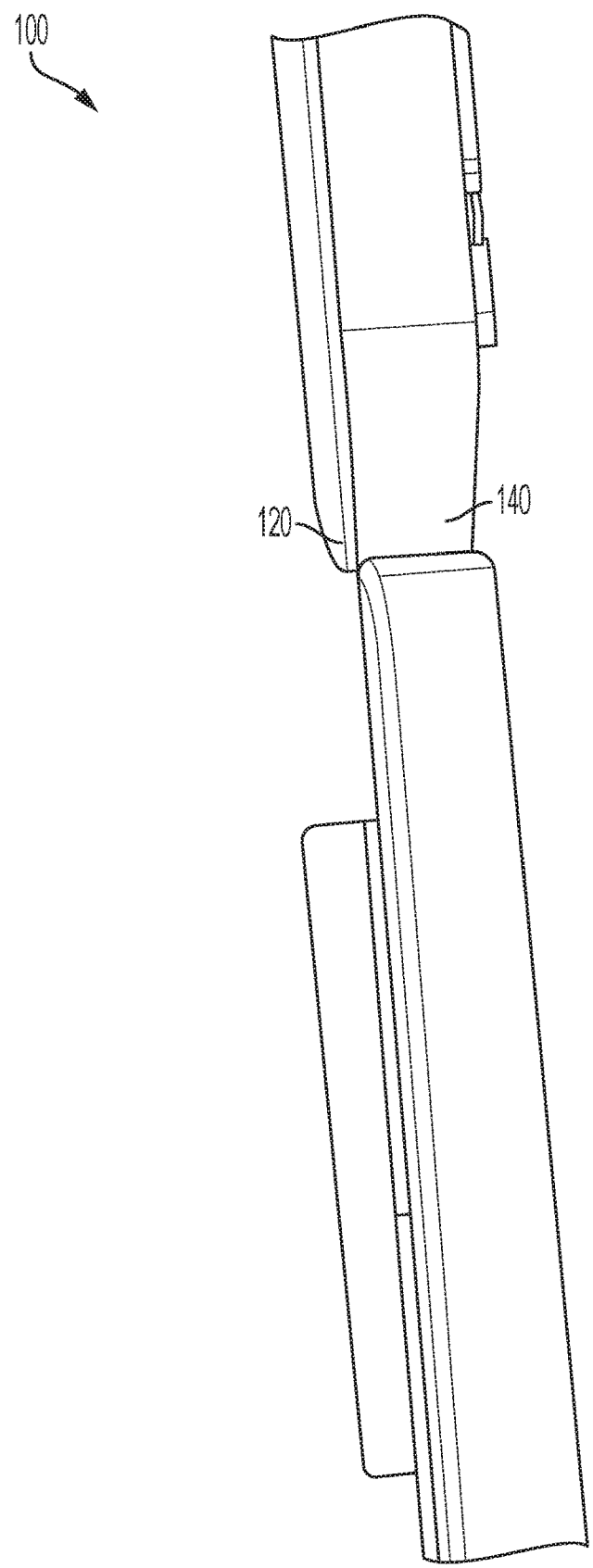
FIGS. 4A-4B are a top view of the system of FIGS. 3A-3B.
Figure 4B:
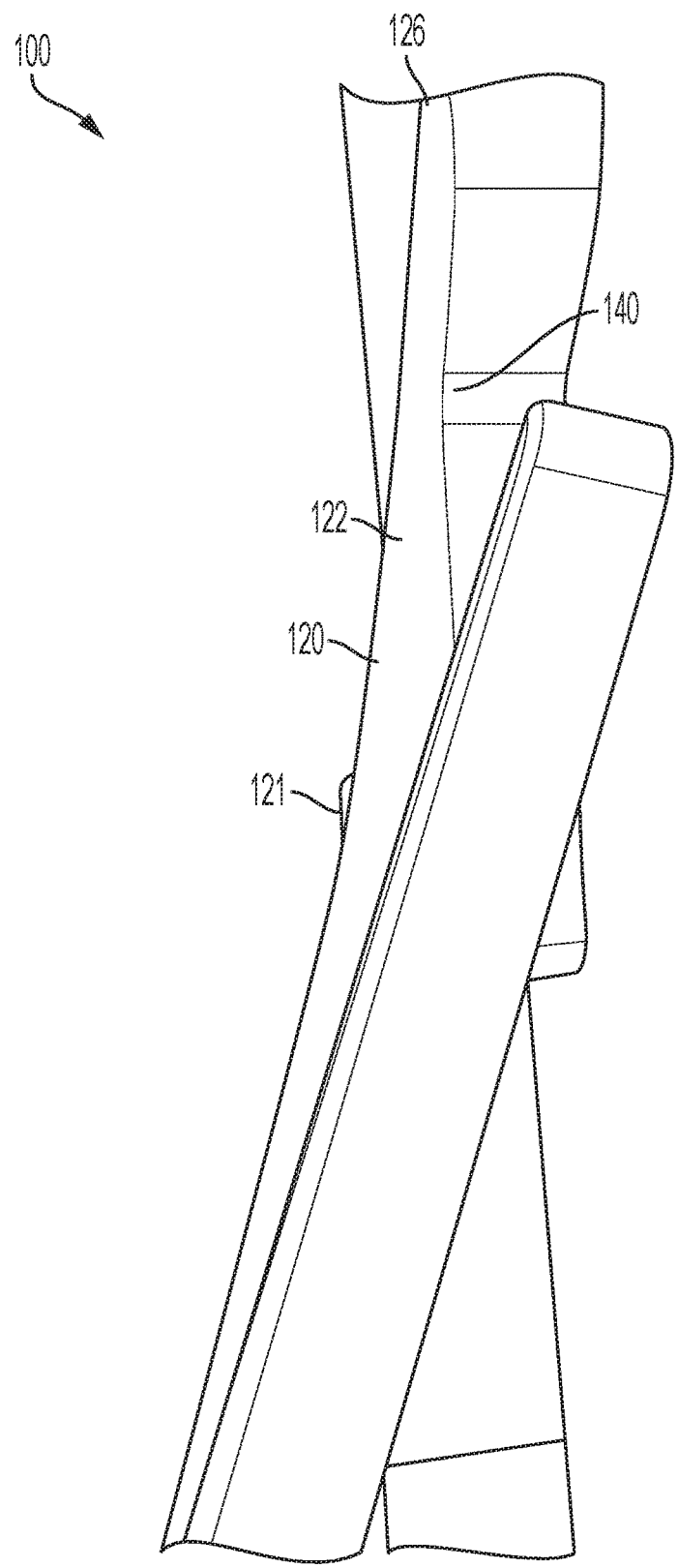

FIGS. 4A and 4B show atop view of the system 100 shown in FIGS. 3A, and 3B, respectively. As shown in FIG. 4B, the reversible support 140 is in at least partial contact with the cover substrate as it is dynamically bent. In one or more embodiments, the reversible support may be attached to the cover substrate via adhesion or local contact.

Figure 5A:
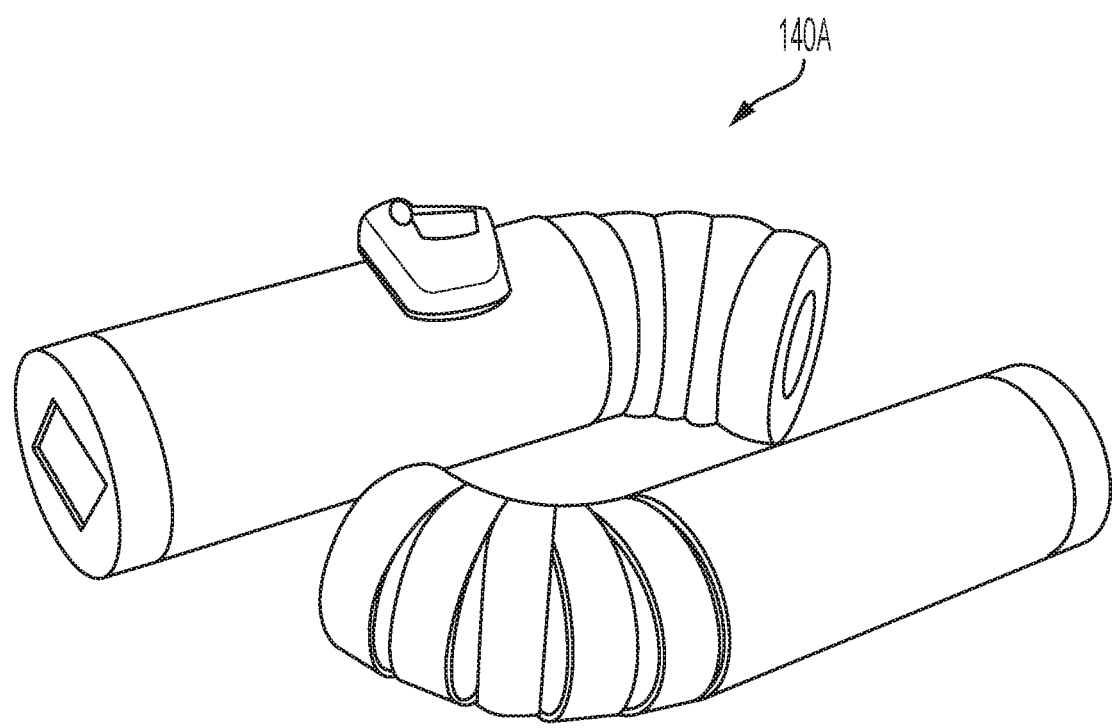
FIG. 5A-5C illustrate embodiments of the reversible support.
Figure 5B:
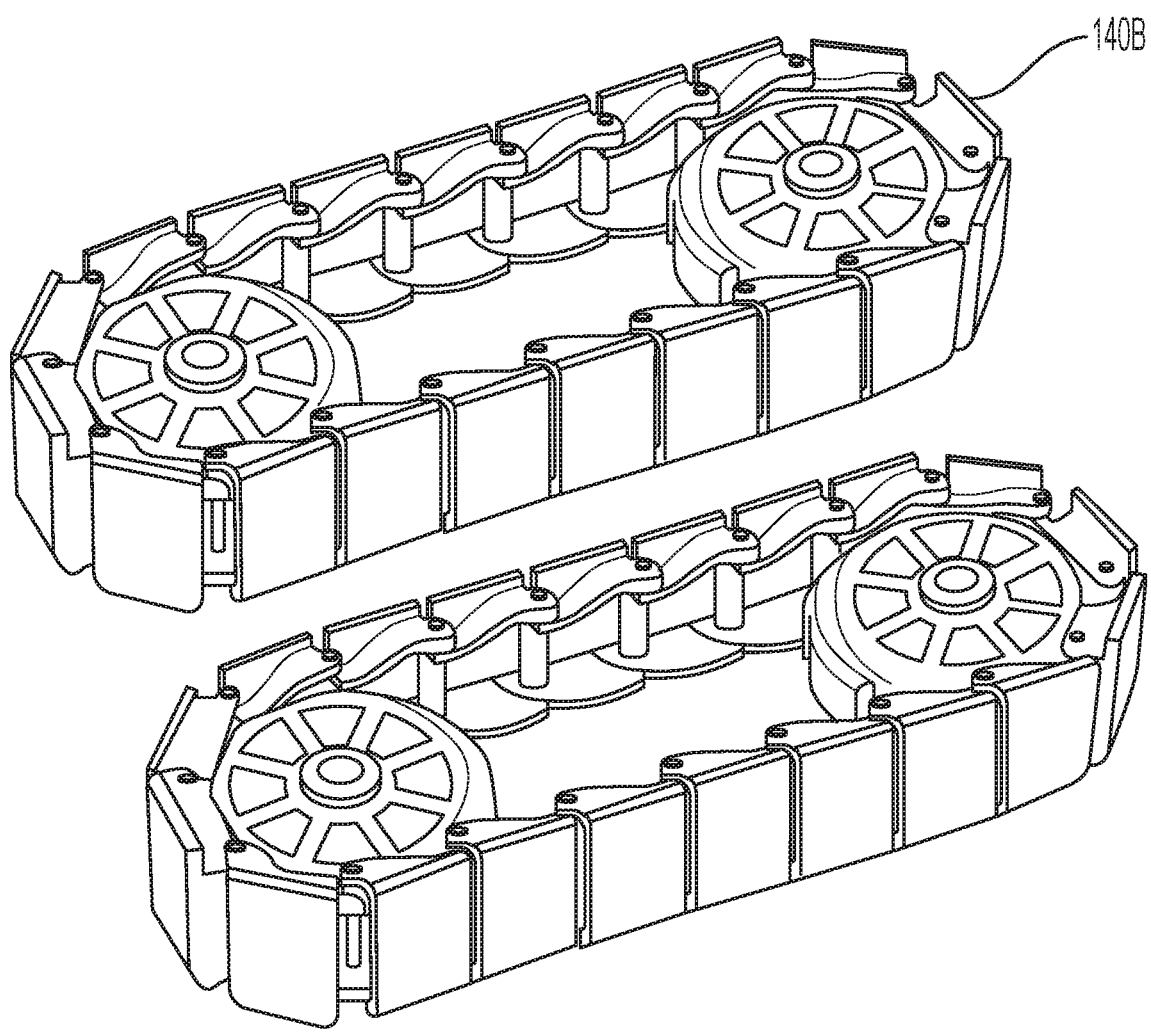
Figure 5C:
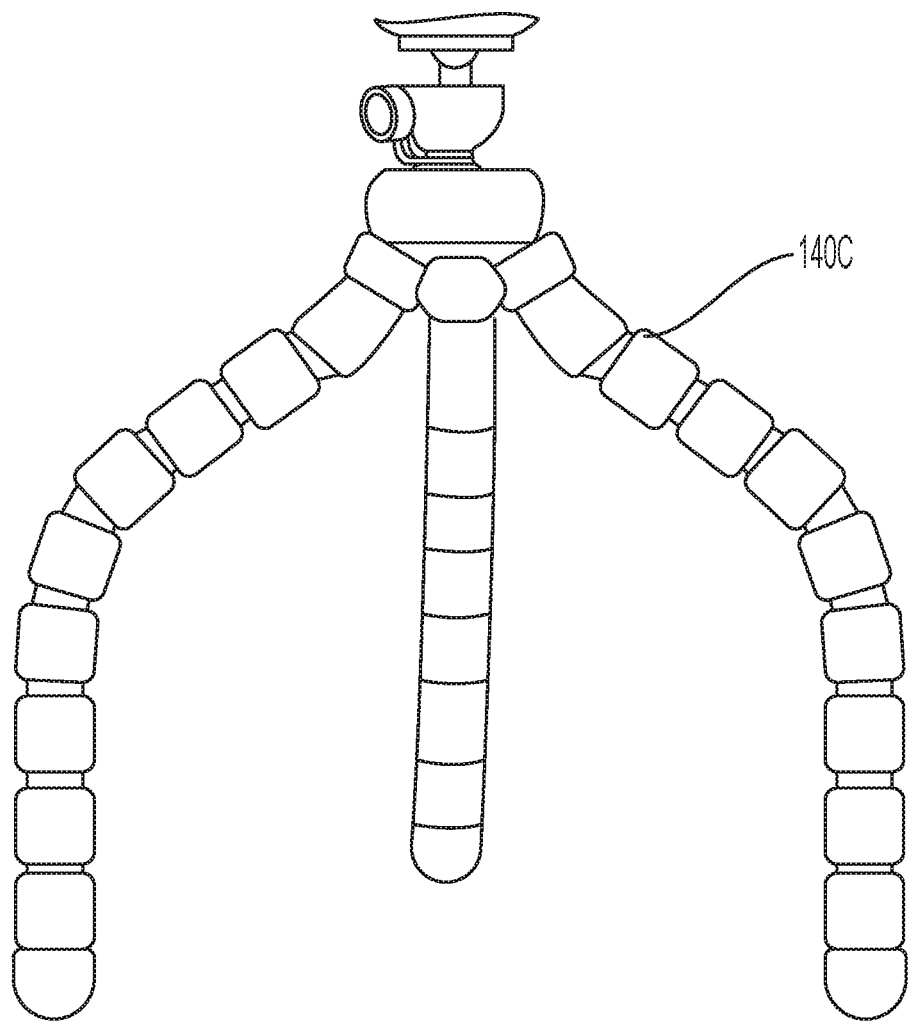
Figure 6A:
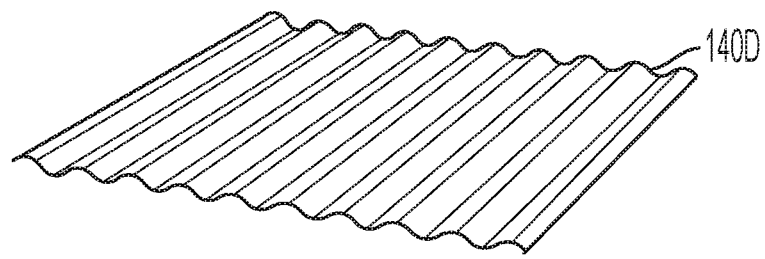
FIGS. 6A-6D illustrate embodiments of the reversible support.
Figure 6B:
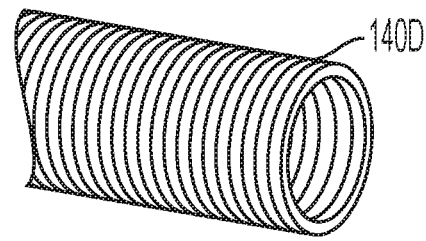
Figure 6C:
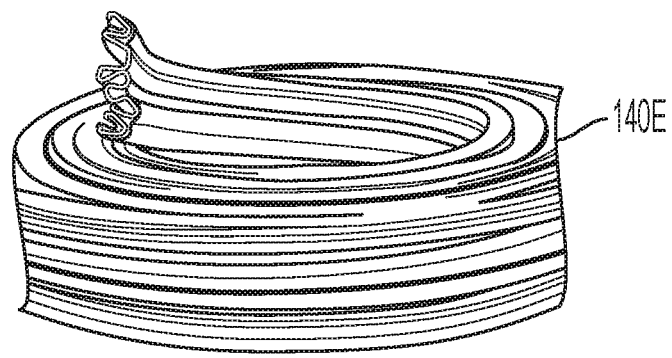
Figure 6D:
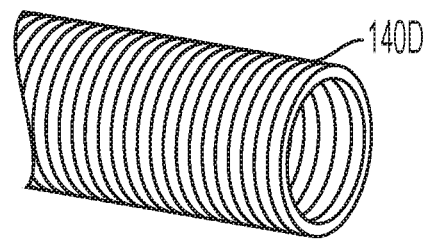

In one or more embodiments, the reversible support is a single component. In one or more embodiments, the reversible support which may be articulated or corrugated concepts. In one or more specific embodiments, the reversible support may be an articulated support or segmented support such as those illustrated in FIGS. 5A-5C (reference numbers 140A, 140B and 140C). Reversible support 140A is metallic segmented support having a tubular configuration. Reversible support 140B is a continuous track in which a continuous band of treads or track plates is driven by two or more wheels. Reversible support 140C is bendable material with segments that allow local bends along the length of the support.

In one or more specific embodiments, the reversible support may be a corrugated support, such as those illustrated in FIGS. 6A-6D (reference numbers 140D, 140E, 140F and 140G). Such corrugated support is not articulated but includes geometrical undulation. The material for the reversible support may be metallic or polymeric (e.g., plastic and/or rubber), or a combination thereof. Reversible support 140D is corrugated panel. Reversible support 140E is a corrugated tube. Reversible support 140F is an accordion rubber material. Reversible support 140G reinforced rubber with metallic support rods.

Figure 7A:
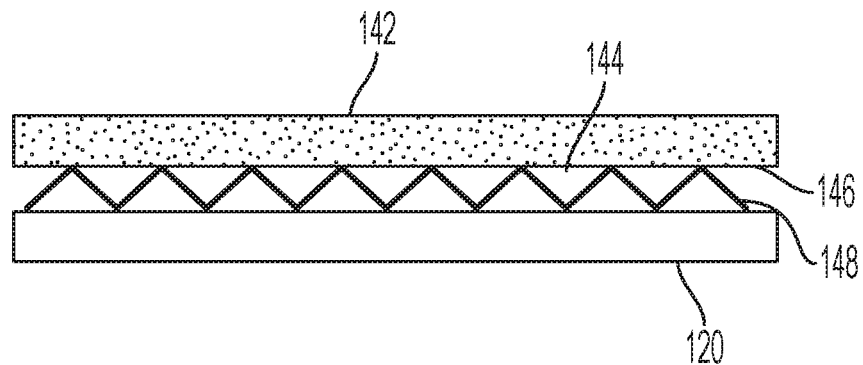
FIGS. 7A-7B illustrate a two-component reversible support, according to one or more embodiments.
Figure 7B:
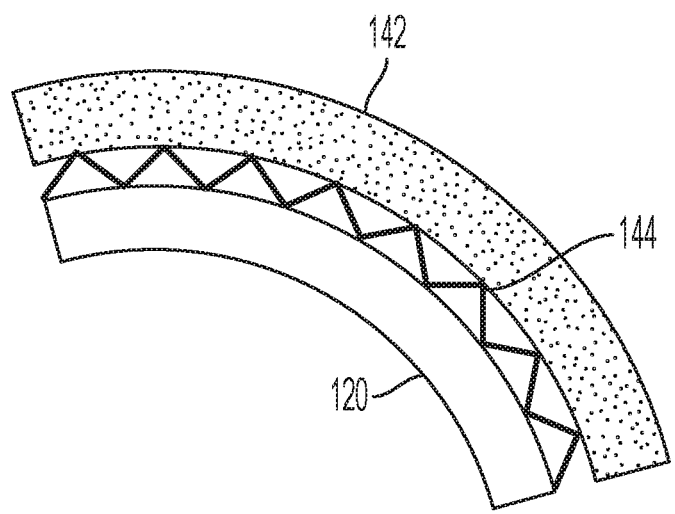
Figure 8A:
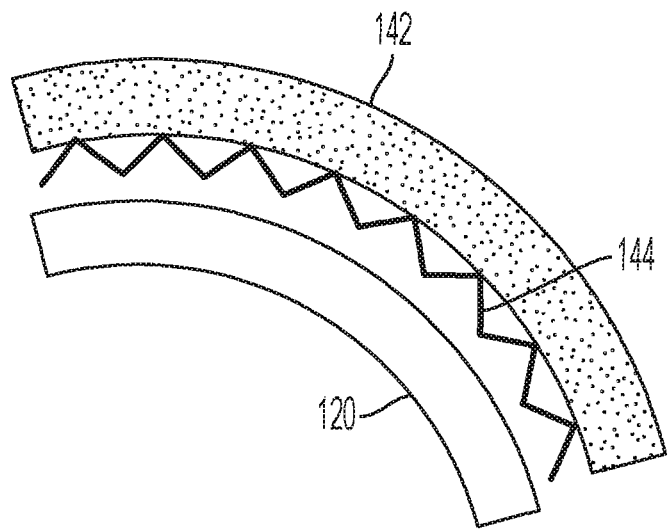
FIGS. 8A-8B illustrate a two-component reversible support, according to one or more embodiments.
Figure 8B:
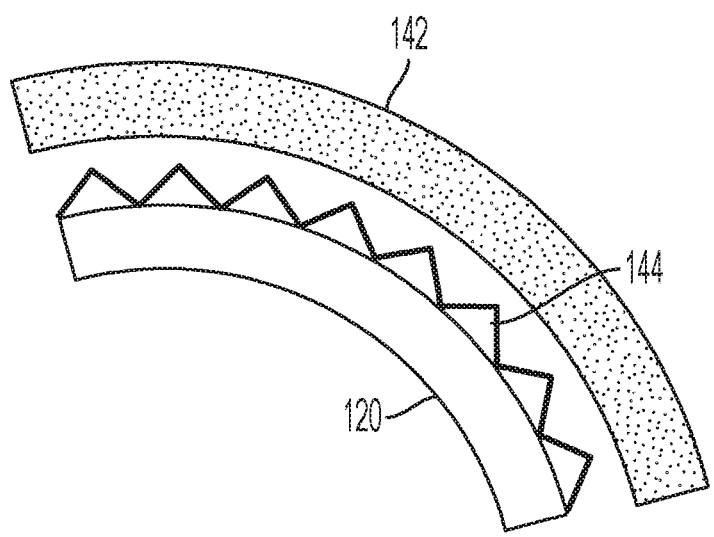

In one or more embodiments, the reversible support includes more than one component. For example, the reversible support includes two interfaces, as shown in FIGS. 7A and 7B. FIG. 7A shows a reversible support 140 with a support component 142 and an articulated component 144 that form two interfaces 146, 148. FIG. 7A illustrates the reversible support when the cover substrate has a first radius of curvature. FIG. 7B shows the reversible support when the cover substrate is dynamically bent to have a second radius of curvature. The materials at the two interfaces could be adhered to one another or may be separate components (as shown in FIGS. 8A and 8B, respectively). In FIG. 8A, the articulated component 144 is adhered to the support component 142. In FIG. 8B, the articulated component 144 is adhered to the cover substrate 120. The reversible support shown in these embodiments may be made from a metallic or polymeric (e.g., plastic and/or rubber) material. In one or more embodiments, the reversible support may be a spring (which may be a steel spring). In one or more embodiments, the reversible support may be a corrugated or accordion shaped material such as a mesh polymer.

As described herein, the reversible support can provide continuous or regular support to the cover substrate when the cover substrate is dynamically bent in a cycle. An automotive interior display system including such a reversible support can meet HIT requirements at any point in the cycle, including when the bend axis of the cover substrate is impacted during HIT.

In one or more embodiments, the reversible support is in contact with the entire second major surface of the cover substrate. The material for the reversible support is unlimited as long as it can dynamically bend the cover substrate along the cycle. In some embodiments, the material may be described as elastic.

In one or more embodiments, the bend axis is positioned along the first and second major surface of the cover substrate at a position along the width in a range from about 0.1*width to about 0.9*width (e.g., 0.2*width to about 0.9*width, 0.25*width to about 0.9*width, 0.3*width to about 0.9*width, 0.*width to about 0.9*width, 0.5*width to about 0.9*width, 0.6*width to about 0.9*width, 0.75*width to about 0.9*width, 0.1*width to about 0.8*width, 0.1*width to about 0.75*width, 0.1*width to about 0.6*width, 0.1*width to about 0.5*width, 0.25*width to about 0.75*width, or 0.4*width to about 0.6*width).

In one or more embodiments, the bend axis is positioned along the first and second major surface of the cover substrate at a position along the length in a range from about 0.1*length to about 0.9*length (e.g., 0.2*length to about 0.9*length, 0.25*length to about 0.9*length, 0.3*length to about 0.9*length, 0.*length to about 0.9*length, 0.5*length to about 0.9*length, 0.6*length to about 0.9*length, 0.75*length to about 0.9*length, 0.1*length to about 0.8*length, 0.1*length to about 0.75*length, 0.1*length to about 0.6*length, 0.1*length to about 0.5*length, 0.25*length to about 0.75*length, or 0.4*length to about 0.6*length).

In one or more embodiments, the automotive interior display system is capable of meeting HIT requirements. For example, when an impactor having a mass of 6.8 kg impacts the first major surface of the cover substrate at an impact velocity of 5.35 m/s to 6.69 m/s, the deceleration of the impactor is 120 g (g-force) or less. In one or more embodiments, the deceleration of the impactor is not greater than 80 g for any 3 ms interval over a time of impact.

In one or more embodiments, after the first major surface is impacted by an impactor at an impact location, the cover substrate is substantially free of local bending at the impact location. In one or more specific embodiments, after the first major surface is impacted by an impactor at an impact location, the cover substrate bends at bend axis. In some embodiments, after the first major surface is impacted by an impactor at an impact location, the cover substrate is substantially free of anticlastic effects.

In one or more embodiments, the cover substrate is capable of being dynamically bent along the bend axis for more than 100 cycles (e.g., about 500 cycles or more, about 1,000 cycles or more, about 2000 cycles or more, about 5000 cycles or more, about 10,000 cycles or more, about 20,000 cycles or more, about 30,000 cycles or more, about 40,000 cycles or more, about 50,000 cycles or more, about 60,000 cycles or more, about 70,000 cycles or more, about 80,000 cycles or more, about 90,000 cycles or more, about 100,000 cycles or more, about 150,000 cycles or more, about 200,000 cycles or more, or about 500,000 cycles or more), without experiencing failure (e.g., fracture or breakage). In one or more specific embodiments, the cover substrate is capable of being dynamically bent along the bend axis for more than 100 cycles (e.g., about 500 cycles or more, about 1,000 cycles or more, about 2000 cycles or more, about 5000 cycles or more, about 10,000 cycles or more, about 20,000 cycles or more, about 30,000 cycles or more, about 40,000 cycles or more, about 50,000 cycles or more, about 60,000 cycles or more, about 70,000 cycles or more, about 80,000 cycles or more, about 90,000 cycles or more, about 100,000 cycles or more, about 150,000 cycles or more, about 200,000 cycles or more, or about 500,000 cycles or more), without delamination between the cover substrate system and the display.

In one or more embodiments, the display is dynamically bendable. In such embodiments, the reversible support dynamically bends display as it dynamically bends the cover substrate along the bend axis in the cycle. In one or more embodiments, the display is dynamically bent along the cycle. In one or more embodiments, the display may be a liquid crystal display, an organic light-emitting diode (OLED) display, a transmissive display or other display. In one or more embodiments, the display is curved in an initial state and has a first radius of curvature, and can be dynamically bent to have a smaller radius of curvature or larger radius of curvature than first radius of curvature. In one or more embodiments a cover substrate exhibits the same curvature in an initial state and can be dynamically bent with the display. In one or more embodiment, the display permanently curved, and the cover substrate is dynamically bendable in an area that is not disposed over the display.

In one or more embodiments, such as shown in FIG. 3A, the dynamically bendable automotive interior display system 100 includes a first frame 130*a* comprising a first frame surface 161, a second frame surface 162 opposing the first frame surface 161 and a frame edge 163 with a thickness 164 defined as the distance between the first frame surface 161 and the second frame surface 162, a frame width 165 defined as a first dimension of one of the first or second frame surfaces 161, 162 orthogonal to the frame thickness 164 and a frame length 166 defined as a second dimension of one of the first or second frame surfaces 161, 162 orthogonal to both the frame thickness 164 and the frame width 165; a frame opening 167 extending from the first frame surface 161 to the second frame surface 162 and surrounded by an interior surface 168 connecting the first frame surface 161 and the second frame surface 162. The display 150 is disposed in the frame opening 167 within the interior surface 168. In one or more embodiments, the dynamically bendable cover substrate 120 described herein is disposed on the first frame surface 161 and over the display 150. In such embodiments the reversible support 140 is attached to at least a portion of the second frame surface 162 and dynamically bends the cover substrate 120 along the bend axis 170 in a cycle from a first radius of curvature to a second radius of curvature and from the second radius of curvature to the first radius of curvature.

In one or more embodiments, the display system can include more than one frame. For example, the system may include a second frame 130B (as shown in FIG. 3A) with a first frame surface 181, a second frame surface 182 opposing the first frame surface 181 and a frame edge 183 with a thickness 184 defined as the distance between the first frame surface 181 and the second frame surface 182, a frame width 185 defined as a first dimension of one of the first or second frame surfaces 181, 182 orthogonal to the frame thickness 184 and a frame length 186 defined as a second dimension of one of the first or second frame surfaces 181, 182 orthogonal to both the frame thickness 184 and the frame width 185; a frame opening 187 extending from the first frame surface 181 to the second frame surface 182 and surrounded by an interior surface 188 connecting the first frame surface 181 and the second frame surface 182. A second display 150 may be disposed in the frame opening 187 within the interior surface 188 of the second frame 130b. In one or more embodiments, the reversible support 140 is attached to the second frame surface 162 of the first frame 130a and the second frame surface 182 of the second frame 130b and positioned between the first frame 130a and the second frame 130b.

In one or more embodiments, the bend axis 170 is positioned between the first frame 130a and the second frame 130b.

Figure 9A:
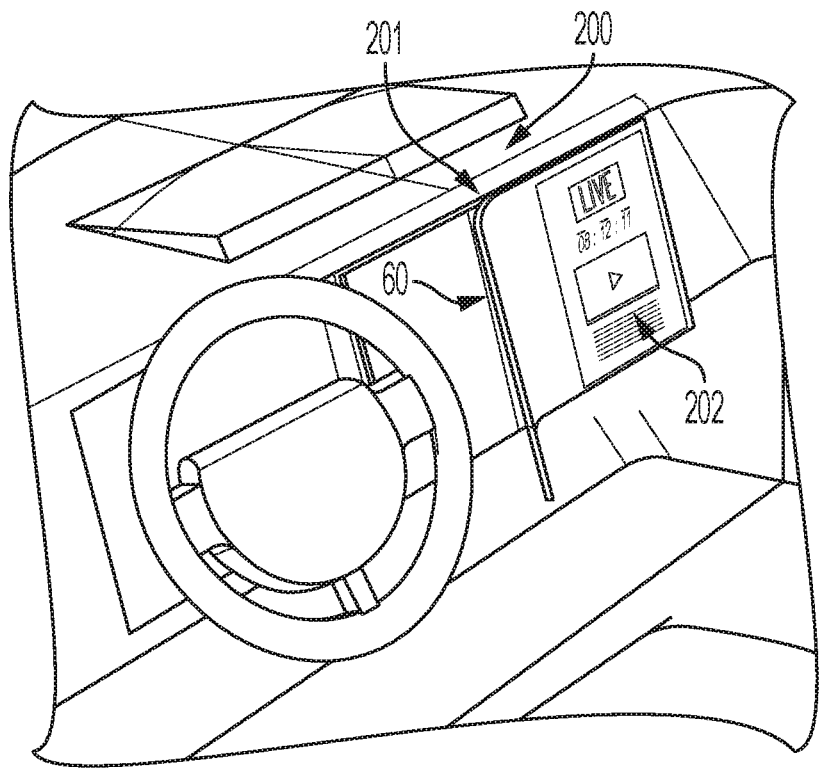
FIG. 9A shows a perspective front view of a dynamically automotive interior display system with the cover substrate having a cold-bent portion and being dynamically bent from a first radius of curvature to a second radius of curvature toward a passenger.
Figure 9B:
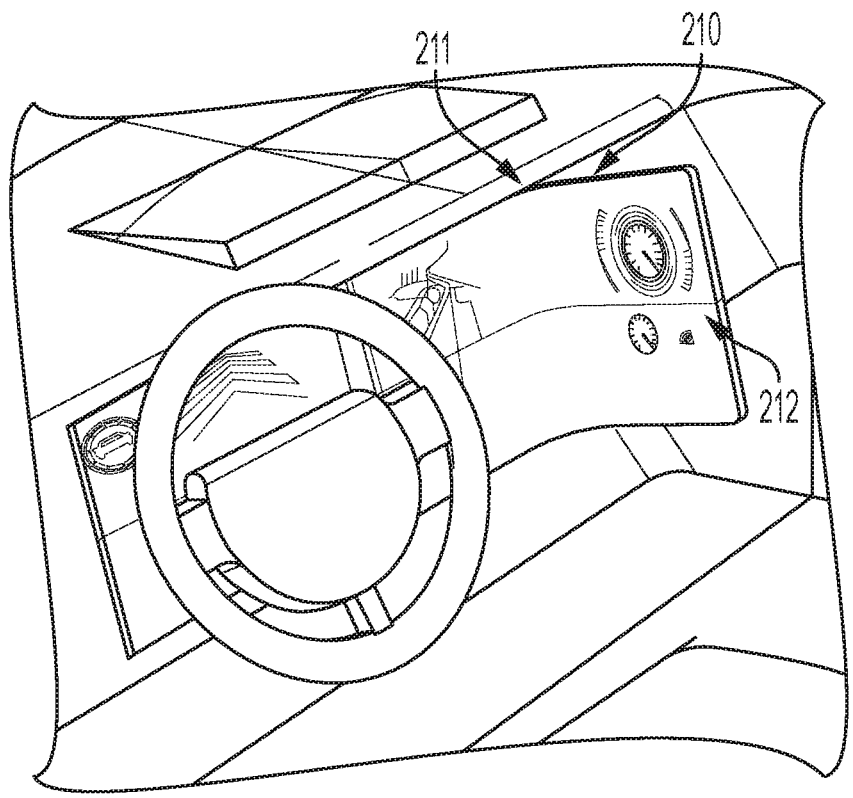
FIG. 9B shows a perspective front view of a dynamically automotive interior display system with the cover substrate having a cold-bent portion and being dynamically bent from a first radius of curvature to a second radius of curvature toward a driver.

FIGS. 9A and 9B show a perspective front view of a dynamically automotive interior display system with the cover substrate having a cold-bent portion and being dynamically bent from a first radius of curvature to a second radius of curvature toward a passenger, and toward a driver, respectively. As shown in FIG. 9A, the system 200 includes a cover substrate with that is dynamically bent from a first radius of curvature to a second radius of curvature along a bend axis 201. A display 202 is disposed under the portion of the cover substrate that is not dynamically bent and a display (not shown) may be disposed on a portion of the cover substrate that is dynamically bent. In FIG. 9B, the system 210 includes a cover substrate with that is dynamically bent from a first radius of curvature to a second radius of curvature along a bend axis 211. A display 212 is disposed under the portion of the cover substrate that is dynamically bent and an optional display (not shown) may be disposed on a portion of the cover substrate that is not dynamically bent.

Figure 10A:
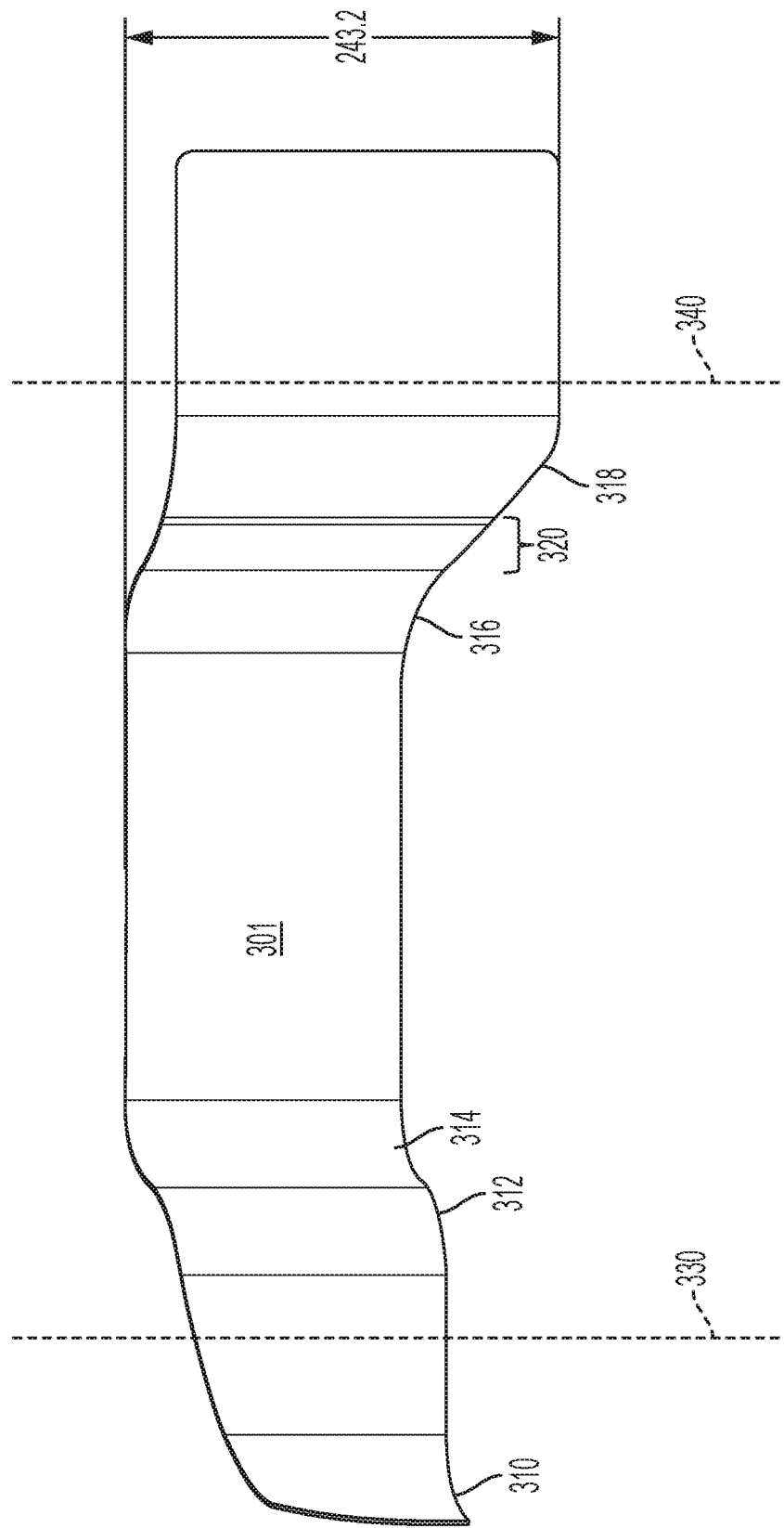
FIG. 10A is a front view of a cold-bent glass article cover substrate having a plurality of curved portions having convex and convex portions and at least one bend axis around which the cover substrate may be dynamically bent.
Figure 10B:
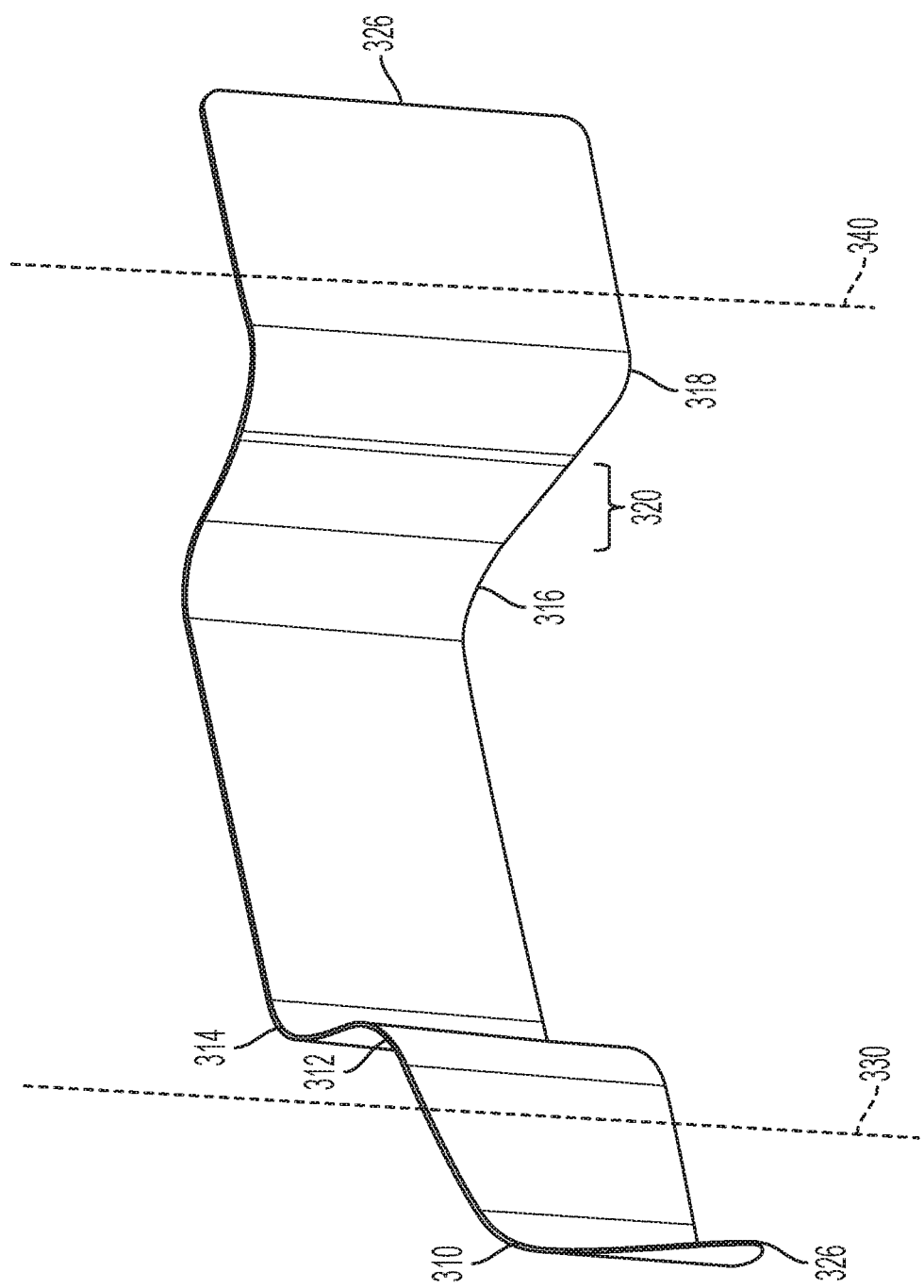
FIG. 10B is a perspective front view of the cold-bent glass article cover substrate shown in FIG. 10A.
Figure 10C:
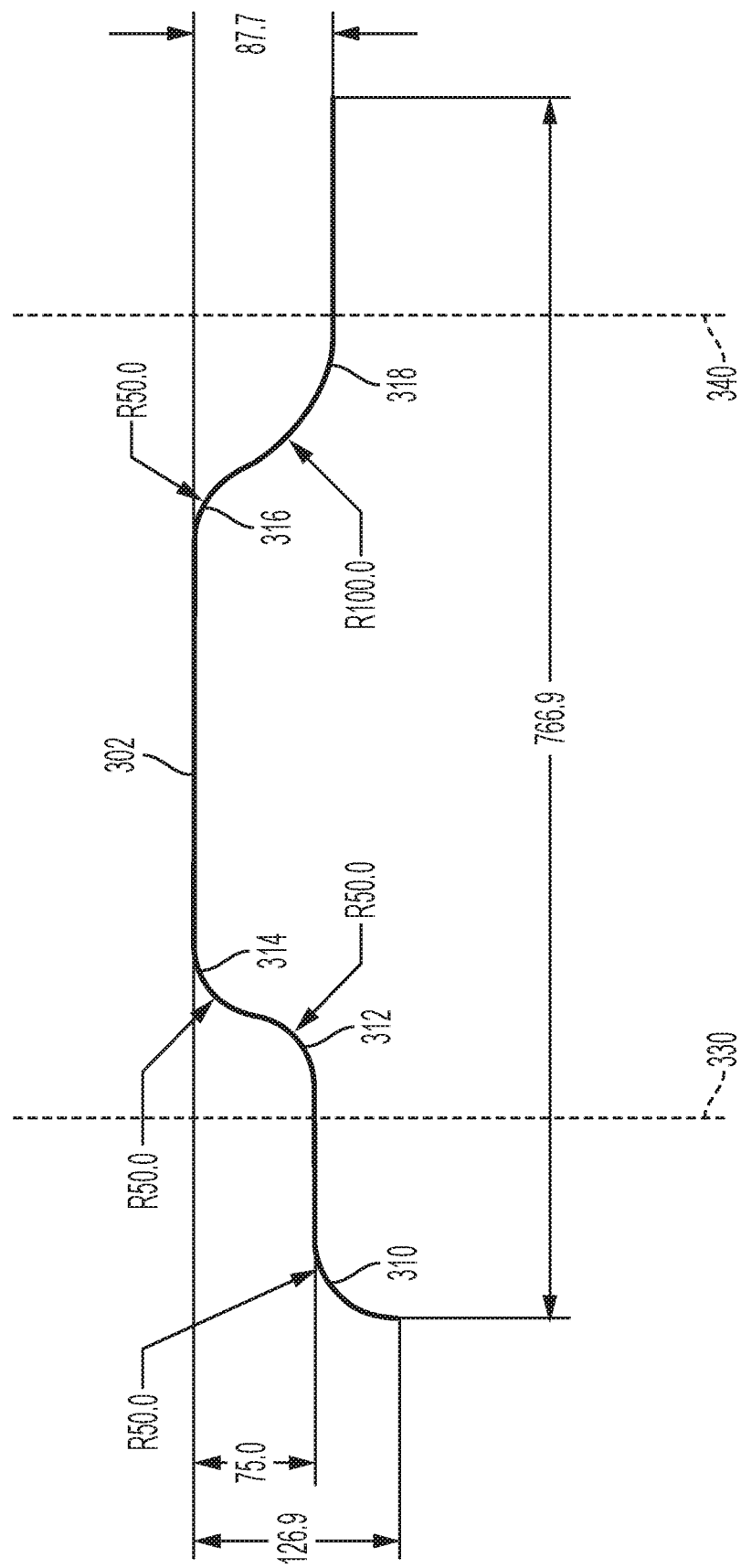
FIG. 10C is atop view of the cold-bent glass article cover substrate shown in FIG. 10A.

FIGS. 10A-10C show different views of a cover substrate 300 that has a first major surface 301, an opposing second major surface 302, and more than one curved portion (e.g., 310, 312, 314, 316 and 318). The curved portions form concave and convex surfaces from the point of view of the first major surface 301. Specifically, curved portions 310, 314 and 316 form concave shapes and curved portions 312 and 318 form convex shapes. Without being bound by theory, the number of curved portions and/or shapes formed (convex or concave) and combinations and order of such curved portions and shapes is unlimited.

In one or more embodiments, the curved portions are separated by a substantially uncurved (or flat) 320. In one or more embodiments, the flat portion manages competing local stresses caused the adjacent curvatures (especially where the adjacent curvatures are in opposing directions). In one or more embodiments, the flat portion has a length in a range from about 10 mm to about 100 mm, from about 20 mm to about 100 mm, from about 30 mm to about 100 mm, from about 40 mm to about 100 mm, from about 50 mm to about 100 mm, from about 60 mm to about 100 mm, from about 10 mm to about 90 mm, from about 10 mm to about 80 mm, from about 10 mm to about 70 mm, from about 10 mm to about 60 mm, from about 10 mm to about 50 mm, or from about 25 mm to about 75 mm. In one or embodiments, the curved substrate has more than one bend axis (e.g., two or more or three or more bend axes). For example, FIGS. 10A-10C has two bend axes 330, 340. In the embodiment shown, the bend axes 330, 340 are embodiments, the portion of the cover substrate that is dynamically bent and the substantially vertical; however, they may be horizontal, diagonal or any other direction. In one or more embodiments, the minor surface 326 at the portion of the covers substrate that is dynamically bent (indicated by the dotted circle) are located outside the area of the cover substrate subject to the type of impacts measured by HIT. In one or more embodiments, the minor surface 326 at the portion of the covers substrate that is dynamically bent (indicated by the dotted circle) are located within the area of the cover substrate subject to the type of impacts measured by HIT; however, the reversible support is collapsible when impacted. In one or more embodiments, the bend axis or axes are positioned to reduce the stress on the minor surface of the cover substrate that is dynamically bent. In one or more embodiments, the bend axis or axes may be positioned along the shortest length or width dimension of the cover substrate to minimize the stress exerted on the cover substrate.

In one or embodiments, the curved substrate 300 may be dynamically bent around a bend axis from a flat shape to a convex shape and back to flat shape, from a flat shape to the concave shape and back to flat shape, from a concave shape to a convex shape and back to a concave shape, from a convex shape to a concave shape and back to a convex shape, from a concave shape to a flat shape back to a concave shape, from a convex shape to a flat shape and back to a convex shape, from a concave shape to a flat shape to a convex shape, or from a convex shape to a flat shape to a concave shape in a single cycle. As shown in FIGS. 11A and 11B, in one or more embodiments, the cover substrate may be foldable and may dynamically bend around a bend axis 350 such that the first radius of curvature is flat when measured from one of the first or second major surface, and the second radius of curvature (measured from the same first or second major surface from which the first radius of curvature is measured) is less than 500 mm, less than 400 mm, less than 300 mm, less than 200 mm, less than 100 mm or less than 50 mm. In one or more embodiments, an underlying display is dynamically bent as the cover substrate is bent. The first and second radii of curvature may be changed depending on the distance 360 desired between the folded portions of the cover substrate. The second radius of curvature may be minimized but the distance 360 may be increased, as shown in FIG. 11A. The second radius of curvature may be reduced but the distance 360 may be increased, as shown in FIG. 11B.

In or embodiments, the cover substrate can dynamically bent along the bend axis to form such shapes for more than 100 cycles (e.g., about 500 cycles or more, about 1,000 cycles or more, about 2000 cycles or more, about 5000 cycles or more, about 10,000 cycles or more, about 20,000 cycles or more, about 30,000 cycles or more, about 40,000 cycles or more, about 50,000 cycles or more, about 60,000 cycles or more, about 70,000 cycles or more, about 80,000 cycles or more, about 90,000 cycles or more, about 100,000 cycles or more, about 150,000 cycles or more, about 200,000 cycles or more, or about 500,000 cycles or more), without experiencing failure (e.g., fracture or breakage). In one or more specific embodiments, the cover substrate is capable of being dynamically bent along the bend axis for more than 100 cycles (e.g., about 500 cycles or more, about 1,000 cycles or more, about 2000 cycles or more, about 5000 cycles or more, about 10,000 cycles or more, about 20,000 cycles or more, about 30,000 cycles or more, about 40,000 cycles or more, about 50,000 cycles or more, about 60,000 cycles or more, about 70,000 cycles or more, about 80,000 cycles or more, about 90,000 cycles or more, about 100,000 cycles or more, about 150,000 cycles or more, about 200, 000 cycles or more, or about 500,000 cycles or more), without delamination between the cover substrate system and the display.

One or more displays may be positioned adjacent the second major surface 302. In one or more embodiments, the displays may be dynamically bent as the cover substrate is dynamically bent. In other words, dynamically bending the cover substrate causes the underlying display to dynamically bend around the bend axis around which the cover system is bent.

In one or more embodiments, the portions of the cover glass that are bent and not bent may be identical in size and shape or may be different in size and/or shape from one another. In one or more embodiments, the portion of the cover substrate that is dynamically bent may have greater length and width dimensions than the portion of the cover substrate that is not dynamically bent.

In one or more embodiments, the minor surface 326 may have a profile that is not planar. For example, the minor surface may have a 2.5D shape, a "C" shape, or 0.65D shape, or may include one or more chamfers.

Aspect (1) pertains to a dynamically bendable cover substrate comprising: a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis, wherein the cover substrate is dynamically bendable around the bend axis in a repeating cycle from a first radius of curvature to a second radius of curvature and from the second radius of curvature to the first radius of curvature.

Aspect (2) pertains to the cover substrate of Aspect (1), wherein the cover substrate comprises a strengthened glass article.

Aspect (3) pertains to the cover substrate of Aspect (2), further comprising a compressive stress (CS) region extending from the first major surface to a depth of compression (DOC), the CS region comprising a maximum CS magnitude ($CS_{max}$) of about 900 MPa or greater and a CS magnitude of 750 MPa or greater at a depth of about 5 micrometers; and a central tension (CT) region having a maximum CT magnitude ($CT_{max}$) disposed at a depth from the first major surface in a range from about 0.25 t to about 0.75 t, wherein the CS region and the CT region define a stress profile along the thickness.

Aspect (4) pertains to the cover substrate of Aspect (3), wherein the $CT_{max}$ magnitude is about 80 MPa or less.

Aspect (5) pertains to the cover substrate of Aspect (3) or Aspect (4), wherein the all points of the CT region within 0.1 t from the depth of $CT_{max}$ comprise a tangent having a non-zero slope.

Aspect (6) pertains to the cover substrate of anyone of Aspects (3) through (5), wherein the DOC that is about 0.2 t or less.

Aspect (7) pertains to the cover substrate of Aspect (6), wherein the DOC is about 0.1 t or less.

Aspect (8) pertains to the cover substrate of anyone of Aspects (3) through (7), wherein the $CT_{max}$ is disposed at a depth from the first major surface in a range from about 0.4 t to about 0.6 t.

Aspect (9) pertains to the cover substrate of anyone of Aspects (3) through (8), wherein at least a portion of the stress profile comprises a spike region extending from the first major surface, a tail region and a knee region between the spike region and the tail region, wherein all points of the stress profile in the spike region comprise a tangent having a slope in magnitude that is in a range from about 15 MPa/micrometer to about 200 MPa/micrometer and all points in the tail region comprise a tangent having a slope in magnitude that is in a range from about 0.01 MPa/micrometer to about 3 MPa/micrometer.

Aspect (10) pertains to the cover substrate of Aspect (9), wherein the CS magnitude in the spike region is in a range from greater than 200 MPa to about 1,500 MPa.

Aspect (11) pertains to the cover substrate of Aspect (9) or Aspect (10), wherein the knee region comprises a CS value in a range from about 5 MPa to about 200 MPa.

Aspect (12) pertains to the cover substrate of Aspect (9) or Aspect (10), wherein the knee region extends from about 10 micrometers to about 50 micrometers from the first major surface.

Aspect (13) pertains to the cover substrate of anyone of Aspects (9) through (12), wherein the tail region extends from about the knee region to the depth of $CT_{max}$.

Aspect (14) pertains to the cover substrate of anyone of Aspects (9) through (13), wherein the tail region comprises one or both of a compressive stress tail region, and a tensile stress tail region.

Aspect (15) pertains to the cover substrate of anyone of Aspects (1) through (14), wherein t is in a range from about 0.05 mm to about 2 mm.

Aspect (16) pertains to the cover substrate of anyone of Aspects (1) through (15), wherein either one of or both the first major surface and the second major surface comprises a surface treatment.

Aspect (17) pertains to the cover substrate of Aspect (16), wherein the surface treatment covers at least a portion of the first major surface and the second major surface.

Aspect (18) pertains to the cover substrate of Aspect (16) or Aspect (17), wherein the surface treatment comprises any one of an easy-to-clean surface, an anti-glare surface, an anti-reflective surface, a haptic surface, and a decorative surface.

Aspect (19) pertains to the cover substrate of Aspect (18), wherein the surface treatment comprises at least two of any one of an easy-to-clean surface, an anti-glare surface, an anti-reflective surface, a haptic surface, and a decorative surface.

Aspect (20) pertains to the cover substrate of Aspect (19), wherein one of the first major surface and the second major surface comprises the anti-glare surface and the other of the first major surface and the second major surface comprises the anti-reflective surface.

Aspect (21) pertains to the cover substrate of Aspect (19), wherein the first major surface comprises either one of or both the anti-glare surface and the anti-reflective surface, and the second major surface comprises the decorative surface.

Aspect (22) pertains to the cover substrate of Aspect (19), wherein the first major surface comprises the anti-reflective surface, and the second major surface comprises one or both the anti-glare surface and the decorative surface.

Aspect (23) pertains to the cover substrate of Aspect (19), wherein the decorative surface is disposed on at least a portion of the periphery and the interior portion is substantially free of the decorative surface.

Aspect (24) pertains to the cover substrate of anyone of Aspects (19) through (23), wherein the decorative surface comprises any one of a wood-grain design, a brushed metal design, a graphic design, a portrait, and a logo.

Aspect (25) pertains to the cover substrate of anyone of Aspects (19) through (24), wherein the anti-glare surface comprises an etched surface, and wherein the anti-reflective surface comprises a multi-layer coating.

Aspect (26) pertains to the cover substrate of any one of Aspects (1) through (25), wherein the cover substrate is substantially free of an anti-splinter film.

Aspect (27) pertains to the cover substrate of any one of Aspects (2) through (26), wherein, when the glass article is curved from the first position to the second position, the $CS_{max}$ at the first major surface increases by more than about 8%.

Aspect (28) pertains to the cover substrate of any one of Aspects (2) through (27), wherein, when the glass article is curved from the first position to the second position that comprises a radius of curvature of about 500 mm, the $DOC_1$ increases by more than about 300%, and a second depth of compression ($DOC_2$) measured from the second major surface decreases by less than 15%.

Aspect (29) pertains to the cover substrate of anyone of Aspects (2) through (28), wherein, when the glass article is curved from the first position to the second position that comprises a radius of curvature of about 250 mm, the $DOC_1$ increases by more than about 600%, and a second depth of compression ($DOC_2$) measured from the second major surface decreases by about less than 25%.

Aspect (30) pertains to the cover substrate of Aspect (29), wherein the CTmax increases by 250% or less.

Aspect (31) pertains to the cover substrate of Aspect (29), wherein the CTmax increases by 400% or less.

Aspect (32) pertains to the cover substrate of anyone of Aspects (1) through (31), wherein the first radius of curvature is greater than the second radius of curvature.

Aspect (33) pertains to a display system comprising: a display; a dynamically bendable cover substrate assembly disposed over the display; wherein the cover substrate assembly comprises a cover substrate having a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and a reversible support attached to at least a portion the second major surface of the cover substrate that dynamically bends the cover substrate around the bend axis in a repeating cycle from a first radius of curvature to a second radius of curvature and from the second radius of curvature to the first radius of curvature.

Aspect (34) pertains to the display system of Aspect (33), wherein, when an impactor having a mass of 6.8 kg impacts the first major surface at an impact velocity of 5.35 m/s to 6.69 m/s, the deceleration of the impactor is 120 g (g-force) or less.

Aspect (35) pertains to the display system of Aspect (34), wherein the deceleration of the impactor is not greater than 80 g for any 3 ms interval over a time of impact.

Aspect (36) pertains to the display system of anyone of Aspects (33) through (35), wherein the first radius curvature or about 10,000 mm or less.

Aspect (37) pertains to the display system of Aspect (36), wherein the cover substrate comprises a cold-bent glass article.

Aspect (38) pertains to the display system of Aspect (36), wherein the cover substrate comprises a hot-formed glass article.

Aspect (39) pertains to the display system of anyone of Aspects (33) through (35), wherein the first radius curvature is greater than about 10,000 mm.

Aspect (40) pertains to the display system of anyone of Aspects (33) through (39), wherein the reversible support is in contact with the second major surface along the bend axis.

Aspect (41) pertains to the display system of anyone of Aspects (33) through (40), wherein the reversible support comprises an elastic material.

Aspect (42) pertains to the display system of anyone of Aspects (33) through (41), further comprising an adhesive between the cover substrate assembly and the display.

Aspect (43) pertains to the display system of any one of Aspects (33) through (42), wherein the bend axis is positioned along the first and second major surface at about 0.1*width to about 0.9*width.

Aspect (44) pertains to the display system of any one of Aspects (33) through (43), wherein the bend axis is positioned along the first and second major surface at about 0.1*length to about 0.9*length.

Aspect (45) pertains to the display system of anyone of Aspects (33) through (44), wherein, after the first major surface is impacted by an impactor at an impact location, the cover substrate is substantially free of local bending at the impact location.

Aspect (46) pertains to the display system of Aspect (45), wherein, after the first major surface is impacted by an impactor at an impact location, the cover substrate bends at bend axis.

Aspect (47) pertains to the display system of Aspect (45) or Aspect (46), wherein, after the first major surface is impacted by an impactor at an impact location, the cover substrate is substantially free of anticlastic effects.

Aspect (48) pertains to the display system of any one of Aspects (33) through (47), wherein the cover substrate is capable of being dynamically bent along the bend axis for more than 100 cycles.

Aspect (49) pertains to the display system of anyone of Aspects (42) through (48), wherein the cover substrate is capable of being dynamically bent along the bend axis for more than 100 cycles without delamination between the cover substrate system and the display.

Aspect (50) pertains to the display system of anyone of Aspects (33) through (49), wherein the thickness is 1.5 mm or less.

Aspect (51) pertains to the display system of anyone of Aspects (33) through (50), wherein the display is dynamically bendable.

Aspect (52) pertains to the display system of Aspect (51), wherein, the reversible support dynamically bends display as it dynamically bends the cover substrate along the bend axis in the cycle.

Aspect (53) pertains to the display system of Aspect (52), wherein, the display is dynamically bent along the cycle.

Aspect (54) pertains to a display system comprising: a first frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface; a display disposed in the frame opening within the interior surface; a dynamically bendable cover substrate disposed on the first frame surface and over the display, the cover substrate having a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and a reversible support attached to at least a portion of the second frame surface and dynamically bends the cover substrate along the bend axis in a cycle from a first radius of curvature to a second radius of curvature and from the second radius of curvature to the first radius of curvature.

Aspect (55) pertains to the display system of Aspect (54), further comprising a second frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface; and a second display disposed in the frame opening within the interior surface of the second frame, wherein the reversible support is attached to the second frame surface of the first frame and the second frame surface of the second frame, and positioned between the first frame and the second frame.

Aspect (56) pertains to the display system of Aspect (55), wherein the bend axis is positioned between the first frame and the second frame.

Aspect (57) pertains to the display system of Aspect (55), wherein the cover substrate comprises a plurality of bend axes.

Aspect (58) pertains to the display system of anyone of Aspects (54) through (57), wherein, when an impactor having a mass of 6.8 kg impacts the first major surface at an impact velocity of 5.35 m/s to 6.69 m/s, the deceleration of the impactor is 120 g (g-force) or less.

Aspect (59) pertains to the display system of Aspect (58), wherein the deceleration of the impactor is not greater than 80 g for any 3 ms interval over a time of impact.

Aspect (60) pertains to the display system of any one of Aspects (54) through (59), wherein the first radius curvature or about 10,000 mm or less.

Aspect (61) pertains to the display system of Aspect (60), wherein the cover substrate comprises a cold-bent glass article.

Aspect (62) pertains to the display system of Aspect (61), wherein the cover substrate comprises a hot-formed glass article.

Aspect (63) pertains to the display system of any one of Aspects (54) through (62), wherein the first radius curvature is greater than about 10,000 mm.

Aspect (64) pertains to the display system of anyone of Aspects (54) through (63), wherein the reversible support comprises a contact surface and 50% or more of the contact surface is in contact with the second major surface.

Aspect (65) pertains to the display system of any one of Aspects (54) through (64), wherein the reversible support comprises an elastic material.

Aspect (66) pertains to the display system of any one of Aspects (54) through (65), further comprising an adhesive between the cover substrate and the first fame surface.

Aspect (67) pertains to the display system of any one of Aspects (54) through (66), further comprising an adhesive between the cover substrate and the display.

Aspect (68) pertains to the display system of any one of Aspects (54) through (67), wherein the bend axis is positioned along the first and second major surface at about 0.1*width to about 0.9*width of the cover substrate.

Aspect (69) pertains to the display system of any one of Aspects (54) through (68), wherein the bend axis is positioned along the first and second major surface at about 0.1*length to about 0.9*length of the cover substrate.

Aspect (70) pertains to the display system of anyone of Aspects (54) through (69), wherein, after the first major surface is impacted by an impactor at an impact location, the cover substrate is substantially free of local bending at the impact location.

Aspect (71) pertains to the display system of Aspect (70), wherein, after the first major surface is impacted by an impactor at an impact location, the cover substrate bends at bend axis.

Aspect (72) pertains to the display system of Aspect (70) or Aspect (71), wherein, after the first major surface is impacted by an impactor at an impact location, the cover substrate is substantially free of anticlastic effects.

Aspect (73) pertains to the display system of anyone of Aspects (54) through (72), wherein the cover substrate is capable of being dynamically bent along the bend axis for more than 100 cycles.

Aspect (74) pertains to the display system of anyone of Aspects (54) through (73), wherein the cover substrate is capable of being dynamically bent along the bend axis for more than 100 cycles without delamination between the cover substrate and the display or delamination between the cover substrate and the frame.

Aspect (75) pertains to the display system of anyone of Aspects (54) through (74), wherein the thickness of the cover substrate is 1.5 mm or less.

Aspect (76) pertains to the display system of anyone of Aspects (54) through (75), wherein the display is dynamically bendable.

Aspect (77) pertains to the display system of Aspect (76), wherein, the reversible support dynamically bends display as it dynamically bends the cover substrate along the bend axis in the cycle.

Aspect (78) pertains to the display system of Aspect (77), wherein, the display is dynamically bent along the cycle.

It will be apparent to those skilled in the art that various modifications and variations can be made without departing from the spirit or scope of the invention.

What is claimed is:

1. A dynamically bendable cover substrate comprising:
 a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis, wherein the cover substrate is dynamically bendable around the bend axis in a repeating cycle from a first radius of curvature to a second radius of curvature and from the second radius of curvature to the first radius of curvature; and wherein, when an impactor having a mass of 6.8 kg impacts the first major surface at an impact velocity of 5.35 m/s to 6.69 m/s, the deceleration of the impactor is 120 g (g-force) or less.

2. A display system comprising:

a display;

a dynamically bendable cover substrate assembly disposed over the display;

wherein the dynamically bendable cover substrate assembly comprises a cover substrate having a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and a reversible support attached to at least a portion of the second major surface of the cover substrate that dynamically bends the cover substrate around the bend axis in a repeating cycle from a first radius of curvature to a second radius of curvature and from the second radius of curvature to the first radius of curvature;

wherein the dynamically bendable cover substrate is capable of being dynamically bent along the bend axis for more than 100 cycles without delamination between the dynamically bendable cover substrate and the display.

3. The display system of claim 2, wherein the first radius of curvature is about 10,000 mm or less.

4. The display system of claim 3, wherein the cover substrate comprises a cold-bent glass article or a hot-formed glass article.

5. The display system of claim 2, further comprising an adhesive between the dynamically bendable cover substrate assembly and the display.

6. The display system of claim 2, wherein the bend axis is positioned along the first and second major surface at about 0.1*width to about 0.9*width or at about 0.1*length to about 0.9*length.

7. The display system of claim 2, wherein the first radius of curvature is greater than about 10,000 mm.

8. A display system comprising:

a display;

a dynamically bendable cover substrate assembly disposed over the display;

wherein the dynamically bendable cover substrate assembly comprises a cover substrate having a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and a reversible support attached to at least a portion of the second major surface of the cover substrate that dynamically bends the cover substrate around the bend axis in a repeating cycle from a first radius of curvature to a second radius of curvature and from the second radius of curvature to the first radius of curvature; and wherein, when an impactor having a mass of 6.8 kg impacts the first major surface at an impact velocity of 5.35 m/s to 6.69 m/s, the deceleration of the impactor is 120 g (g-force) or less.

9. The display system of claim 8, wherein the deceleration of the impactor is not greater than 80 g for any 3 ms interval over a time of impact.

10. A display system comprising:

a display;

a dynamically bendable cover substrate assembly disposed over the display;

wherein the dynamically bendable cover substrate assembly comprises a cover substrate having a first major surface, second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and a reversible support attached to at least a portion of the second major surface of the cover substrate that dynamically bends the cover substrate around the bend axis in a repeating cycle from a first radius of curvature to a second radius of curvature and from the second radius of curvature to the first radius of curvature; and wherein, after the first major surface is impacted by an impactor at an impact location, the dynamically bendable cover substrate is substantially free of local bending at the impact location.

11. The display system of claim 10, wherein, after the first major surface is impacted by an impactor at an impact location, the dynamically bendable cover substrate bends at the bend axis.

12. The display system of claim 10, wherein, after the first major surface is impacted by an impactor at an impact location, the dynamically bendable cover substrate is substantially free of anticlastic effects.

13. A display system comprising:

a first frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface;
a display disposed in the frame opening within the interior surface;
a dynamically bendable cover substrate disposed on the first frame surface and over the display, the dynamically bendable cover substrate having a first major surface, a second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and
a reversible support attached to at least a portion of the second frame surface and dynamically bends the dynamically bendable cover substrate along the bend axis in a cycle from a first radius of curvature to a second radius of curvature and from the second radius of curvature to the first radius of curvature;
further comprising a second frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface; and
a second display disposed in the frame opening within the interior surface of the second frame,
wherein the reversible support is attached to the second frame surface of the first frame and the second frame surface of the second frame, and positioned between the first frame and the second frame; and
wherein the dynamically bendable cover substrate is capable of being dynamically bent along the bend axis for more than 100 cycles without delamination between the dynamically bendable cover substrate and the display or delamination between the dynamically bendable cover substrate and the frame.

14. The display system of claim 13, wherein the bend axis is positioned between the first frame and the second frame.

15. The display system of claim 13, wherein the dynamically bendable cover substrate comprises a plurality of bend axes.

16. The display system of claim 13, wherein the first radius of curvature is about 10,000 mm or less.

17. The display system of claim 16, wherein the dynamically bendable cover substrate comprises a cold-bent glass article or a hot-formed glass article.

18. The display system of claim 13, wherein the first radius curvature is greater than about 10,000 mm.

19. The display system of claim 13, wherein the reversible support comprises a contact surface and 50% or more of the contact surface is in contact with the second major surface.

20. The display system of claim 13, further comprising an adhesive between the dynamically bendable cover substrate and the display.

21. The display system of claim 13, wherein the bend axis is positioned along the first and second major surface at about 0.1*width to about 0.9*width of the dynamically bendable cover substrate or at about 0.1*length to about 0.9*length of the dynamically bendable cover substrate.

22. The display system of claim 13, wherein the dynamically bendable cover substrate is capable of being dynamically bent along the bend axis for more than 100 cycles.

23. A display system comprising:
a first frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface;
a display disposed in the frame opening within the interior surface;
a dynamically bendable cover substrate disposed on the first frame surface and over the display, the dynamically bendable cover substrate having a first major surface, a second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and
a reversible support attached to at least a portion of the second frame surface and dynamically bends the dynamically bendable cover substrate along the bend axis in a cycle from a first radius of curvature to a second radius of curvature and from the second radius of curvature to the first radius of curvature;
further comprising a second frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface; and
a second display disposed in the frame opening within the interior surface of the second frame,
wherein the reversible support is attached to the second frame surface of the first frame and the second frame surface of the second frame, and positioned between the first frame and the second frame; and
wherein, when an impactor having a mass of 6.8 kg impacts the first major surface at an impact velocity of 5.35 m/s to 6.69 m/s, the deceleration of the impactor is 120 g (g-force) or less.

24. The display system of claim 23, wherein the deceleration of the impactor is not greater than 80 g for any 3 ms interval over a time of impact.

25. A display system comprising:
a first frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface;
a display disposed in the frame opening within the interior surface;
a dynamically bendable cover substrate disposed on the first frame surface and over the display, the dynamically bendable cover substrate having a first major surface, a second major surface opposing the first major surface and a minor surface connecting the first major surface and the second major surface, a thickness defined as a distance between the first major surface and the second major surface, a width defined as a first dimension of one of the first or second major surfaces orthogonal to the thickness, a length defined as a second dimension of one of the first or second major surfaces orthogonal to both the thickness and the width, and a bend axis; and
a reversible support attached to at least a portion of the second frame surface and dynamically bends the dynamically bendable cover substrate along the bend axis in a cycle from a first radius of curvature to a second radius of curvature and from the second radius of curvature to the first radius of curvature;
further comprising a second frame comprising a first frame surface, a second frame surface opposing the first frame surface, and a frame edge with a thickness defined as the distance between the first frame surface and the second frame surface, a frame width defined as a first dimension of one of the first or second frame surfaces orthogonal to the frame thickness, and a frame length defined as a second dimension of one of the first or second frame surfaces orthogonal to both the frame thickness and the frame width; a frame opening extending from the first frame surface to the second frame surface and surrounded by an interior surface connecting the first frame surface and the second frame surface; and
a second display disposed in the frame opening within the interior surface of the second frame,
wherein the reversible support is attached to the second frame surface of the first frame and the second frame surface of the second frame, and positioned between the first frame and the second frame; and
wherein, after the first major surface is impacted by an impactor at an impact location, the dynamically bendable cover substrate is substantially free of local bending at the impact location.

26. The display system of claim 25, wherein, after the first major surface is impacted by an impactor at an impact location, the dynamically bendable cover substrate bends at bend axis.

27. The display system of claim 25, wherein, after the first major surface is impacted by an impactor at an impact location, the dynamically bendable cover substrate is substantially free of anticlastic effects.

* * * * *